United States Patent
Kuwahara et al.

(10) Patent No.: US 8,278,973 B2
(45) Date of Patent: Oct. 2, 2012

(54) IMPEDANCE CONTROL CIRCUIT AND SEMICONDUCTOR DEVICE INCLUDING THE SAME

(75) Inventors: Shunji Kuwahara, Chuo-ku (JP); Hiroki Fujisawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 192 days.

(21) Appl. No.: 12/707,354

(22) Filed: Feb. 17, 2010

(65) Prior Publication Data

US 2010/0207680 A1 Aug. 19, 2010

(30) Foreign Application Priority Data

Feb. 19, 2009 (JP) .............................. 2009-036771

(51) Int. Cl.
*H03B 1/00* (2006.01)
(52) U.S. Cl. ........................................... 327/112
(58) Field of Classification Search .................. 327/110, 327/112
See application file for complete search history.

(56) References Cited

U.S. PATENT DOCUMENTS

| 5,606,275 | A  | * | 2/1997  | Farhang et al. ............... 327/108 |
| 6,356,105 | B1 | * | 3/2002  | Volk ................................. 326/30 |
| 6,429,679 | B1 | * | 8/2002  | Kim et al. ....................... 326/30 |
| 6,486,698 | B2 | * | 11/2002 | Yanagawa ........................ 326/30 |
| 6,509,778 | B2 | * | 1/2003  | Braceras et al. ............... 327/308 |
| 6,690,211 | B1 | * | 2/2004  | Huang et al. .................... 327/108 |
| 7,084,663 | B2 | * | 8/2006  | Oguri .............................. 326/30 |
| 7,288,966 | B2 | * | 10/2007 | Choi et al. ....................... 326/83 |
| 7,362,128 | B2 | * | 4/2008  | Choi et al. ....................... 326/30 |
| 7,443,203 | B2 | * | 10/2008 | Oguri ............................. 326/83 |
| 7,443,212 | B2 | * | 10/2008 | Hayashi et al. ................ 327/108 |
| 7,973,553 | B1 | * | 7/2011  | Wang et al. ..................... 326/30 |
| 2008/0046212 | A1 |   | 2/2008  | Yoko et al. |
| 2011/0248742 | A1 | * | 10/2011 | Osanai et al. ................... 326/30 |

FOREIGN PATENT DOCUMENTS

JP 2008-048361 A 2/2008

* cited by examiner

*Primary Examiner* — Thomas J Hiltunen
(74) *Attorney, Agent, or Firm* — Sughrue Mion, PLLC

(57) ABSTRACT

To include two counter circuits that change impedances of two replica circuits, respectively, and an impedance adjustment control circuit that controls the counter circuits to update count values of the counter circuits. The impedance adjustment control circuit controls one of the counter circuits to finish updating the count value of the counter circuit in response to a change of the impedance of the corresponding replica circuit from a state of being lower than an impedance of an external resistor to a state of being higher than the impedance of the external resistor, and controls the other counter circuit to finish updating the count value of the other counter circuit in response to a change of the impedance of the other replica circuit from a state of being higher than the impedance of the former replica circuit to a state of being lower than the impedance of the former replica circuit. With this configuration, the adjust errors generated in the replica circuits are canceled.

18 Claims, 24 Drawing Sheets

| TIME | FLIP-FLOP CIRCUIT 62 | FLIP-FLOP CIRCUIT 61 |
|---|---|---|
| t11 | L | L |
| t12 | H | L |
| t13 | H | H |
| t14 | H | H |
| t15 | L | H | → hit1

FIG.11A

| TIME | FLIP-FLOP CIRCUIT 62 | FLIP-FLOP CIRCUIT 61 |
|---|---|---|
| t11 | L | L |
| t12 | H | L |
| t13 | L | H | → hit1

INVERTED

FIG.11B

IMPEDANCE CONTROL CIRCUIT AND SEMICONDUCTOR DEVICE INCLUDING THE SAME

BACKGROUND OF THE INVENTION

1. Field of the Invention

The present invention relates to an impedance control circuit, and more particularly relates to an impedance control circuit that adjusts an impedance of an output buffer provided in a semiconductor device. The present invention also relates to a semiconductor device including such an impedance control circuit.

2. Description of Related Art

Recently, a very high data transfer rate is required to transfer data between semiconductor devices (for example, between a CPU and a memory). To realize this very high transfer rate, amplitudes of input and output signals are increasingly set lower. Lower amplitudes of input and output signals make required accuracy of an impedance of an output buffer quite higher.

The impedance of the output buffer is influenced by not only manufacturing process conditions but also a surrounding temperature or a power supply voltage. Due to this, when the output buffer is required to have high impedance accuracy, an output buffer with an impedance control function is adopted. An impedance control circuit referred to as "calibration circuit" performs such impedance control for the output buffer (see Japanese Patent Application Laid-Open No. 2008-48361).

As described in Japanese Patent Application Laid-Open No. 2008-48361, the impedance control circuit includes replica circuits that are the same as the output buffer in configuration. When the impedance control circuit performs an impedance control operation, the impedance control circuit compares a voltage appearing on a calibration terminal with a reference voltage, in a state of connecting the calibration terminal to an external resistor, thereby adjusting an impedance of the replica circuit. By reflecting control contents of the replica circuits in the output buffer, the impedance control circuit sets the impedance of the output buffer to a desired value.

During a typical impedance control operation, the impedance control circuit first adjusts the impedance of the pull-up replica circuit based on an impedance of the external resistor, and then adjusts the impedance of the pull-down replica circuit based on the impedance of the impedance-controlled pull-up replica circuit.

Impedance control of the replica circuits is performed by a counter circuit. Specifically, if the impedance of each of the replica circuits is higher than a target impedance, the counter circuit updates a count value thereof to reduce the impedance of the replica circuit by one step by one step. When the counter circuit detects that the impedance of the replica circuit is below the target impedance, the counter circuit determines that the impedance of the replica circuit reaches the target value and finishes updating the count value thereof. Conversely, if the counter circuit detects that the impedance of each replica circuit is lower than the target impedance, the counter circuits updates the count value thereof to increase the impedance of the replica circuit by one step by one step. When the counter circuit detects that the impedance of the replica circuit exceeds the target impedance, the counter circuit determines that the impedance of the replica circuit reaches the target value and finishes updating the count value thereof.

As described above, because impedance control of the replica circuits is performed with the counter circuit, the obtained impedances are discrete values. Therefore, the impedances of the replica circuits after the impedance control often include adjust errors with respect to the target impedances, respectively. This adjust error of the pull-up replica circuit, the impedance of which is subjected to impedance control based on the external resistor, is up to one bit of the count value.

Due to this, the adjust error is added to the impedance of the pull-down replica circuit, the impedance of which is subjected to impedance control based on the impedance of the pull-up replica circuit. As a result, the adjust error of the pull-down replica circuit can be up to two bits of the count value.

FIG. 24 is a graph for explaining the conventional problems.

As shown in FIG. 24, the counter circuit performs impedance control on an impedance "a" of the pull-up replica circuit so as to coincide with an impedance Ze of the external resistor from a state where the impedance "a" is lower than the impedance Ze. As a result, the impedance "a" reaches higher value than the impedance Ze by an adjust error $\Delta Z_{PU}$ ("a"=Ze+$\Delta Z_{PU}$). Next, the counter circuit starts performing impedance control on an impedance "b" of the pull-down replica circuit from a state where the impedance "b" is lower than the target impedance, that is, the impedance "a"=Ze+$\Delta Z_{PU}$. As a result, the impedance "b" reaches higher value than the target impedance Ze+$\Delta Z_{PU}$ by an adjust error $\Delta Z_{PD}$ ("b"=Ze+$\Delta Z_{PU}$+$\Delta Z_{PD}$).

In this way, the conventional impedance control circuit has the problem that the pull-down replica circuit is greater in the adjust error than the pull-up replica circuit and the adjust error of the pull-down replica circuit reaches up to two bit of the count value.

This problem occurs not only to a case that the impedances of both the pull-up and pull-down replica circuits at the start of impedance control are lower than the target impedances, respectively but also to an opposite case, that is, a case that the impedances of both the pull-up and pull-down replica circuits at the start of the impedance control are higher than the target impedances, respectively.

SUMMARY

In one embodiment, there is provided a device that includes first and second replica circuits, impedances of the first and second replica circuits being variable, first and second counter circuits that change the impedances of the first and second replica circuits, respectively, and a control circuit that controls the first and second counter circuits to update count values of the first and second counter circuits. The control circuit controls the first counter circuit to finish updating the count value of the first counter circuit in response to a change of the impedance of the first replica circuit in one of a direction of changing the impedance of the first replica circuit from a state of being higher than a predetermined impedance to a state of being lower than the predetermined impedance and a direction of changing the impedance of the first replica circuit from the state of being lower than the predetermined impedance to the state of being higher than the predetermined impedance, and controls the second counter circuit to finish updating the count value of the second counter circuit in response to a change of the impedance of the second replica circuit in other direction of a direction of changing the impedance of the second replica circuit from a state of being higher than the impedance of the first replica circuit to a state of being lower than the impedance of the first replica circuit and a direction of changing the impedance of the second replica circuit from the state of being lower than the impedance of the first replica circuit to the state of being higher than the impedance of the first replica circuit.

In another embodiment, there is provided a device that includes the impedance control circuit as described above, a first driver circuit set to have same impedance as an impedance of the first replica circuit; a second driver circuit set to have same impedance as an impedance of the second replica circuit, and an output terminal provided between a connection point between the first driver circuit and the second driver circuit.

In still another embodiment, there is provided a device comprising: a first terminal; a first driving circuit coupled to drive the first terminal; and a control circuit coupled to the first driving circuit and including first and second circuit unit, the first circuit unit changing a first impedance of the first driving circuit in stepwise manner in either direction of up and down to cause the first impedance of the driving circuit to approach or become substantially equal to a first reference value, and the second circuit unit producing a first detection signal when the first impedance of the first driving circuit has reached or crossed the first predetermined value at least two times, the first circuit unit responding to the first detection signal and terminating changing the first impedance of the first driving circuit.

In still another embodiment, there is provided a device comprising: a terminal; a first driving circuit coupled to the terminal and indicative of a first impedance; and a control portion controlling the first driving circuit such that the first impedance approaches or become substantially equal to a first reference impedance value in a stepwise manner, the control portion detecting that the first impedance has reached or crossed the first reference impedance value a first predetermined value at least two times, the control circuit terminating changing of the first impedance in response to a first detection result indicating that the first impedance has reached or crossed the first reference impedance value the first predetermined value.

According to the present invention, the adjust error generated by the first replica circuit and the adjust error generated by the second replica circuit cancel each other. This can reduce the impedance adjust error of the second replica circuit impedance controlled based on the impedance of the first replica circuit. Accordingly, the present invention can ensure a more accurate impedance control operation.

BRIEF DESCRIPTION OF THE DRAWINGS

The above features and advantages of the present invention will be more apparent from the following description of certain preferred embodiments taken in conjunction with the accompanying drawings, in which:

FIG. 11A is table showing changes of values of the flip-flop circuits included in the decision circuit in a case of no influence of noise on the impedance control circuit;

FIG. 11B is table showing changes of values of the flip-flop circuits included in the decision circuit in a case of influence of noise on the impedance control circuit;

DETAILED DESCRIPTION OF THE EMBODIMENTS

Preferred embodiments of the present invention will be explained below in detail with reference to the accompanying drawings.

Figure 1:
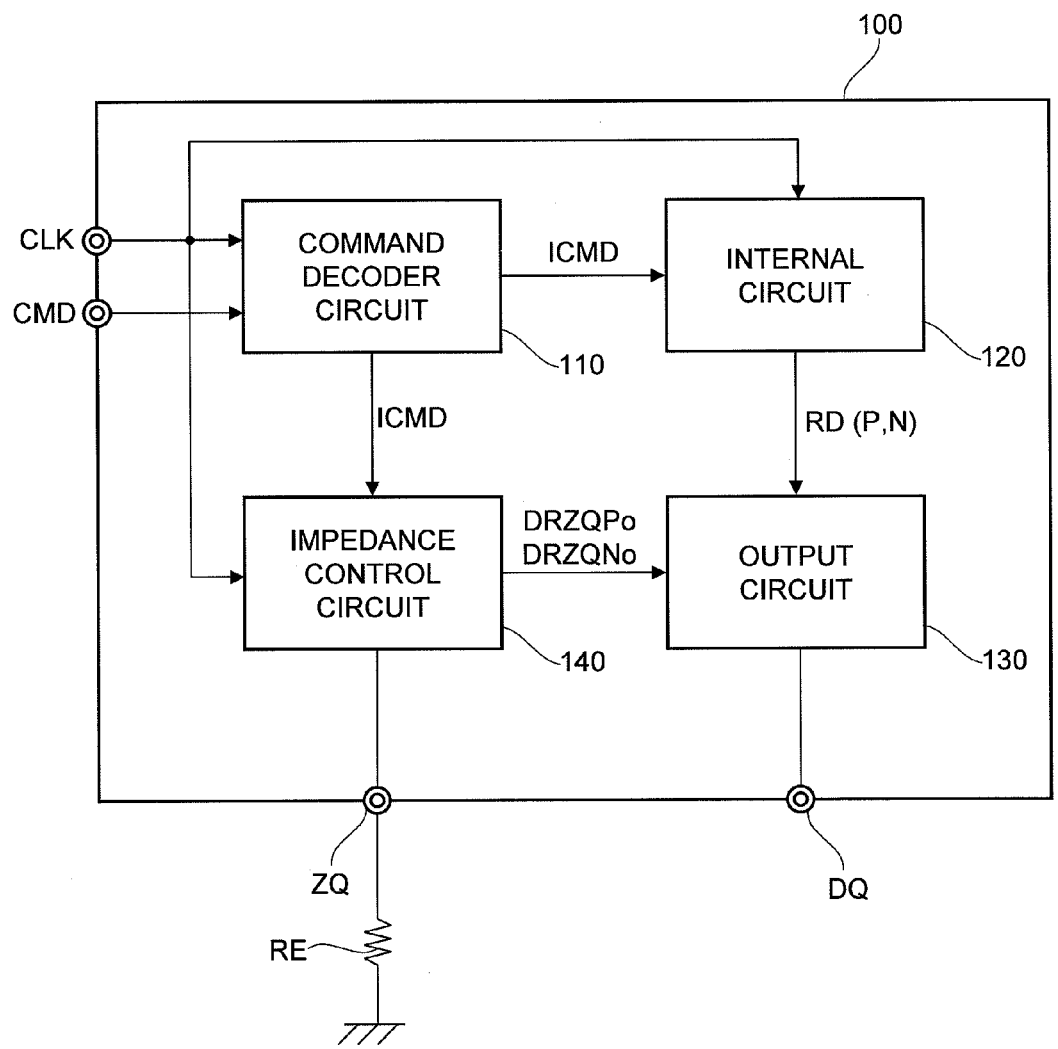
FIG. 1 is a block diagram showing a configuration of principal parts of a semiconductor device according to a first embodiment.

FIG. 1 is a block diagram showing a configuration of principal parts of a semiconductor device 100 according to a first embodiment of the present invention.

As shown in FIG. 1, the semiconductor device 100 according to the first embodiment includes a clock terminal CLK, a command terminal CMD, a command decoder circuit 110, an internal circuit 120, an output circuit 130, an impedance control circuit 140, an output terminal DQ, and a calibration terminal ZQ. An external resistor RE is connected to the calibration terminal ZQ.

The clock terminal CLK is input a clock signal from an outside. The command terminal CMD is input a command signal for controlling the internal circuit 120 and the impedance control circuit 140.

The command decoder circuit 110 fetches in the command signal synchronously with the clock signal, decodes the command signal, and generates an internal command signal ICMD indicating an operation corresponding to the input command signal. The internal command ICMD is supplied to the internal circuit 120 and the impedance control circuit 140.

The internal circuit 120 performs a predetermined processing indicated by the internal command signal ICMD. The internal circuit 120 supplies an output signal RD to the output circuit 130 when the internal command signal ICMD indicates an instruction to output a signal to the outside. The output signal RD includes output signals P and N as described later.

The output circuit 130 supplies the output signal RD supplied from the internal circuit 120 to the outside via the output terminal DQ.

The impedance control circuit 140 performs impedance control on an impedance of the output circuit 130 viewed from the output terminal DQ to a desired impedance when the internal command signal ICMD for instructing impedance control of the impedance of the output circuit 130 is supplied.

Figure 2:
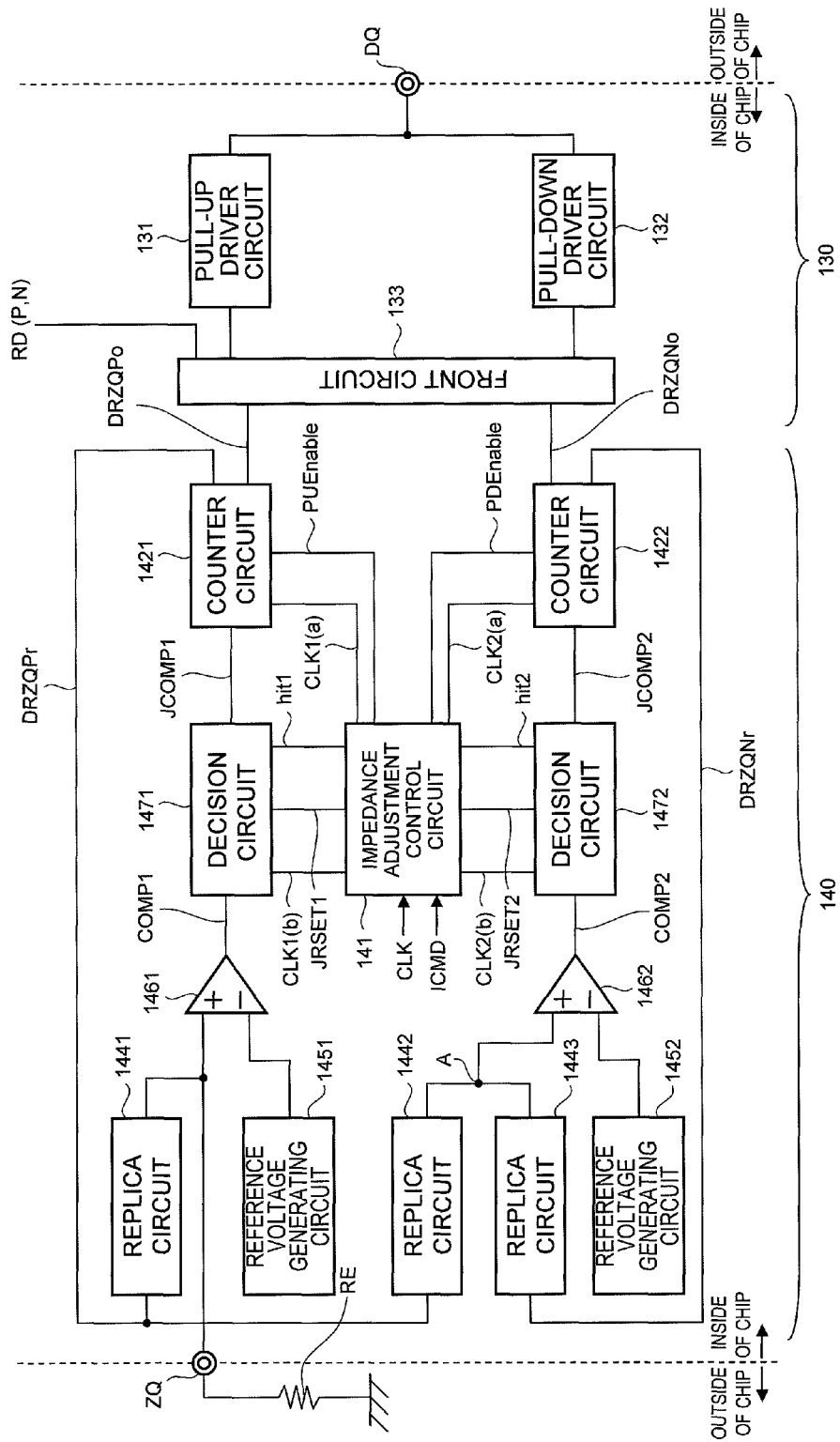
FIG. 2 is a block diagram showing a configuration of the output circuit and that of the impedance circuit according to the first embodiment.

FIG. 2 is a block diagram showing a configuration of the output circuit 130 and that of the impedance circuit 140.

As shown in FIG. 2, the output circuit 130 includes a pull-up driver circuit (a pull-up driver) 131 that serves as a first driver circuit, a pull-down driver circuit (a pull-down driver) 132 that serves as a second driver circuit, and a front circuit 133.

The pull-up driver circuit 131 drives the output terminal DQ to H level, a first logic level. The pull-down driver circuit 132 drives the output terminal DQ to L level, a second logic level. If the semiconductor device according to the first embodiment includes an ODT (On Die Termination) function, the pull-up driver circuit 131 and the pull-down driver circuit 132 also function as termination resistors. One Example of the semiconductor device including the ODT function is a DRAM (Dynamic Random Access Memory).

Figure 3:
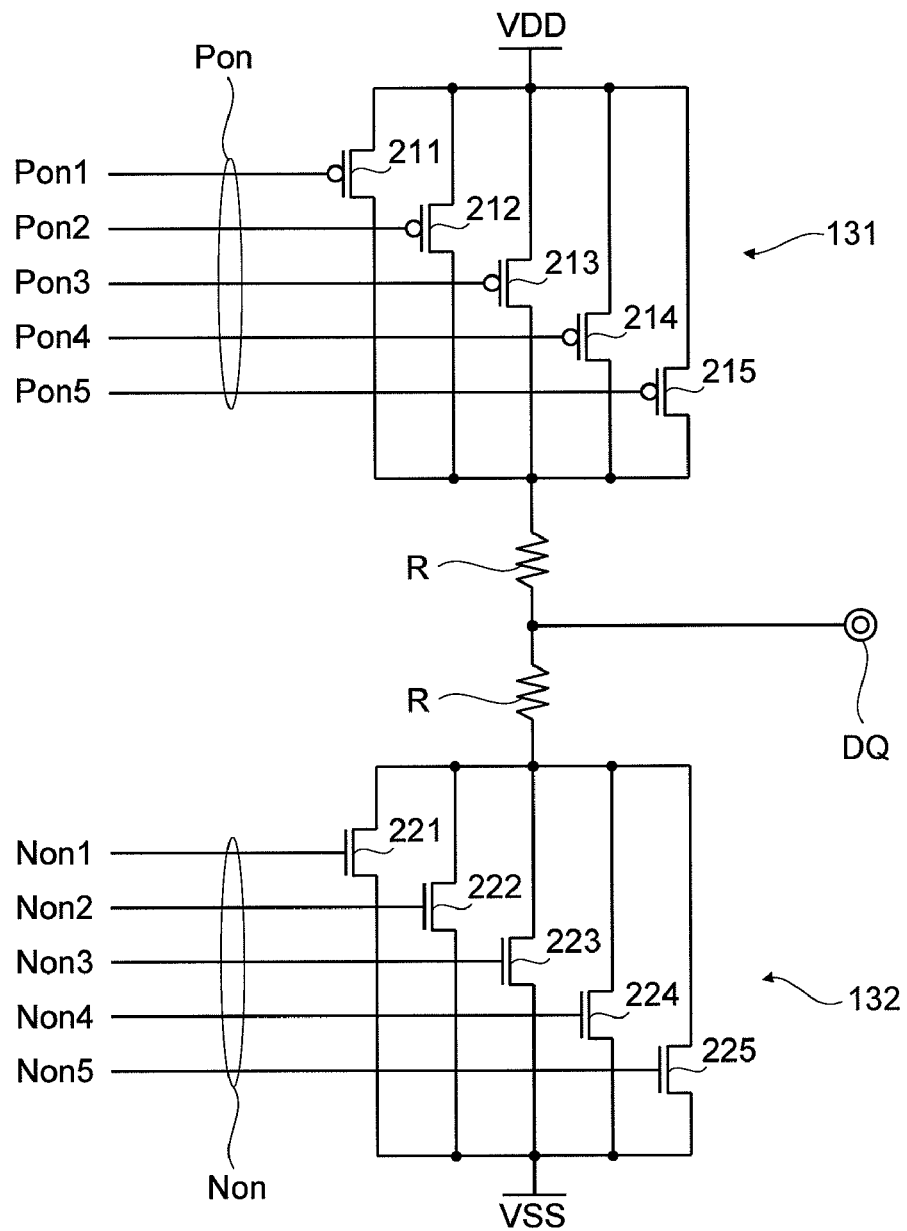
FIG. 3 is a circuit diagram of the pull-up driver circuit and the pull-down driver circuit.

FIG. 3 is a circuit diagram of the pull-up driver circuit 131 and the pull-down driver circuit 132.

As shown in FIG. 3, the pull-up driver circuit 131 includes a plurality of (five in the first embodiment) output transistors 211 to 215 that are P-channel MOS transistors and that are connected in parallel between a power supply potential VDD and the output terminal DQ. The pull-down driver circuit 132 includes a plurality of (five in the first embodiment) output transistors 221 to 225 that are N-channel MOS transistors and that are connected in parallel between the output terminal DQ and a ground potential VSS. Further, resistors R are connected between the output terminal DQ and the pull-up driver circuit 131 and between the output terminal DQ and the pull-down driver circuit 132, respectively. For example, tungsten (W) resistors can be used as the resistors R.

Five actuating signals Pon1 to Pon5 constituting an ON signal Pon are supplied to gates (control electrodes) of the output transistors 211 to 215 in the pull-up driver circuit 131, respectively. Therefore, the output transistors 211 to 215 in the pull-up driver circuit 131 are controlled to be turned on or off based on the actuating signals Pon1 to Pon5, individually and respectively. Likewise, five actuating signals Non1 to Non5 constituting an ON signal Non are supplied to gates (control electrodes) of the output transistors 221 to 225 in the pull-down driver circuit 132, respectively. Therefore, the output transistors 221 to 225 in the pull-down driver circuit 132 are controlled to be turned on or off based on the actuating signals Non1 to Non5, individually and respectively.

Each of the pull-up driver circuit 131 and the pull-down driver circuit 132 is designed to have a predetermined impedance at conductive state. Generally, however, transistors have irregular ON-resistances depending on manufacturing conditions and change depending on environmental temperatures or power supply voltages during an operation. Due to this, these circuits do not always have a desired impedance. To set actual impedances of these circuits to the desired impedances, it is necessary to adjust the number of transistors to be turned on. To achieve this object, parallel circuits of a plurality of output transistors are used.

To adjust an impedance of the output circuit 130 in a fine and wide range, it is preferable to set W/L (gate width/gate length) ratios of the output transistors 211 to 215 or 221 to 225 constituting each of the pull-up driver circuit 131 and the pull-down driver circuit 132 different. It is particularly preferable to set different W/L ratios by weighing powers of 2 to the W/L ratios, respectively. That is, when the W/L ratio of the output transistor 211 is set to "1WLp", the W/L ratios of the output transistors 212 to 215 are preferably set to "2WLp", "4WLp", "8WLp", and "16WLp", respectively. Likewise, when the W/L ratio of the output transistor 221 is set to "1WLn", the W/L ratios of the output transistors 222 to 225 are preferably set to "2WLn", "4WLn", "8WLn", and "16WLn", respectively.

By so configuring the output circuit 130 and appropriately selecting the output transistors to be turned on according to the actuating signals Pon1 to Pon5 and Non1 to Non5, the pull-up driver circuit 131 and the pull-down driver circuit 132 can be set to have desired impedances, respectively, irrespectively of the irregularities resulting from the manufacturing conditions, temperature changes or the like.

Meanwhile, the front circuit 133 sets the impedances of the pull-up driver circuit 131 and the pull-down driver circuit 132 in response to impedance control signals DRZQPo and DRZQNo from the impedance control circuit 140, respectively. Furthermore, the output signal RD (=P and N) from the internal circuit 120 is also supplied to the front circuit 133.

Figure 4:
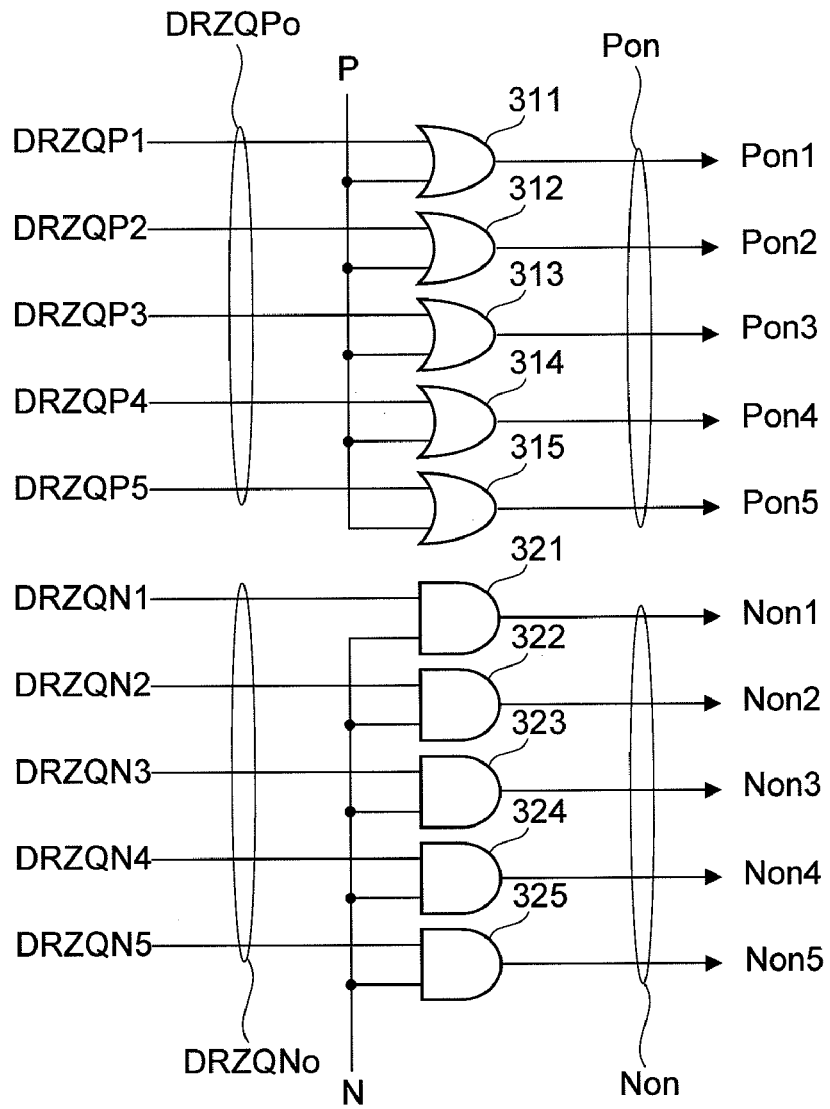
FIG. 4 is a circuit diagram of the front circuit.

FIG. 4 is a circuit diagram of the front circuit 133.

As shown in FIG. 4, the front circuit 133 includes five OR circuits 311 to 315 and five AND circuits 321 to 325. The output signal P is supplied to the OR circuits 311 to 315 in common and impedance control signals DRZQP1 to DRZQP5 are supplied thereto, respectively. The output signal N is supplied to the AND circuits 321 to 325 in common and impedance control signals DRZQN1 to DRZQN5 are supplied thereto, respectively.

The output signals P and N constitute the output signal RD. When a signal to be output from the output terminal DQ is high level, each of the output signals P and N is set low level. When the signal to be output from the output terminal DQ is low level, each of the output signals P and N is set high level. Accordingly, the output signals P and N can be combined into a single signal. However, when the output circuit 130 performs an ODT operation, it is necessary to set the output signal P to low level and the output signal N to high level. The semiconductor device according to the first embodiment uses the different signals P and N on the presumption of this case. As described above, the internal circuit 120 shown in FIG. 1 generates the output signals P and N.

By so configuring the front circuit 133, when the output signals P and N are low level, then at least one of the actuating signals Pon1 to Pon5 output from the OR circuits 311 to 315 is activated to low level, and all the actuating signals Non1 to Non5 output from the AND circuits 321 to 325 are deactivated to low level. In this case, the impedance control signals DRZQPo decide which of the actuating signals Pon1 to Pon5 to activate.

Likewise, when the output signals P and N are high level, then at least one of the actuating signals Non1 to Non5 output from the AND circuits 321 to 325 is activated to high level, and all the actuating signals Pon1 to Pon5 output from the OR circuits 311 to 315 are deactivated to high level. In this case, the impedance control signals DRZQNo decide which of the actuating signals Non1 to NPon5 to activate.

The output circuit 130 is configured as described above. A circuit configuration of the impedance control circuit 140 is described next.

As shown in FIG. 2, the impedance control circuit 140 includes an impedance adjustment control circuit 141, counter circuits 1421 and 1422, replica circuits 1441, 1442, and 1443, reference voltage generation circuits 1451 and 1452, comparison circuit 1461 and 1462, and decision circuits 1471 and 1472.

The impedance adjustment control circuit 141 fetches in an internal command signal (for example, ZQCS or ZQCL) indicating impedance control and the clock signal CLK. The impedance adjustment control circuit 141 supplies impedance control clocks CLK1(a) and CLK2(a) to the counter circuits 1421 and 1422, respectively. In addition, the impedance adjustment control circuit 141 supplies impedance control clocks CLK1(b) and CLK2(b) and reset signals JRSET1 and JRSET2 to the decision circuits 1471 and 1472, respectively.

Note that the impedance adjustment control circuit 141 includes a frequency divider that frequency-divides the clock signal CLK by a predetermined division ratio and that outputs division results. The impedance adjustment control circuit 141 outputs the output from the frequency divider as the impedance control clocks CLK1(a), CLK2(a), CLK1(b), and CLK2(b). Furthermore, the impedance adjustment control circuit 141 outputs the impedance control clocks CLK1(a) and CLK2(a) so that the impedance control clocks CLK1(a) and CLK2(a) have predetermined delays with respect to the impedance control clocks CLK1(b) and CLK2(2), respectively. Moreover, the impedance adjustment control circuit 141 supplies a pull-up enable signal PUEnable to the counter circuit 1421 and a pull-down enable signal PDEnable to the counter circuit 1422.

In the first embodiment, by way of example, the pull-up enable signal PUEnable is activated by the internal command signal (for example, ZQCS or ZQCL) indicating impedance control and deactivated by activating a hit signal hit1. In addition, in the first embodiment, by way of example, the pull-down enable signal PDEnable is activated by activating the hit signal hit1 and deactivated by activating a hit signal hit2.

The counter circuit 1421 counts the impedance control clock CLK1(a) in a period in which the pull-up enable signal PUEnable is activated to high level. The counter circuit 1421 changes whether to increase or decrease a count value according to a logic level of a decision signal JCOMP1 that is an output signal from the decision circuit 1471, and supplies an impedance control signal DRZQPr that is the count value to the replica circuits 1441 and 1442 so as to adjust impedances of the replica circuits 1441 and 1442. Furthermore, the counter circuit 1421 supplies the impedance control signal DRZQPo that is the count value to the pull-up driver circuit 131.

The counter circuit 1422 counts the impedance control clock CLK2(a) in a period in which the pull-down enable signal PDEnable is activated to high level. The counter circuit 1422 changes whether to increase or decrease a count value according to a logic level of a decision signal JCOMP2 that is an output signal from the decision circuit 1472, and supplies an impedance control signal DRZQNr that is the count value to the replica circuits 1443 so as to adjust an impedance of the replica circuit 1443. Furthermore, the counter circuit 1422 supplies the impedance control signal DRZQNo that is the count value to the pull-down driver circuit 132.

Figure 5:
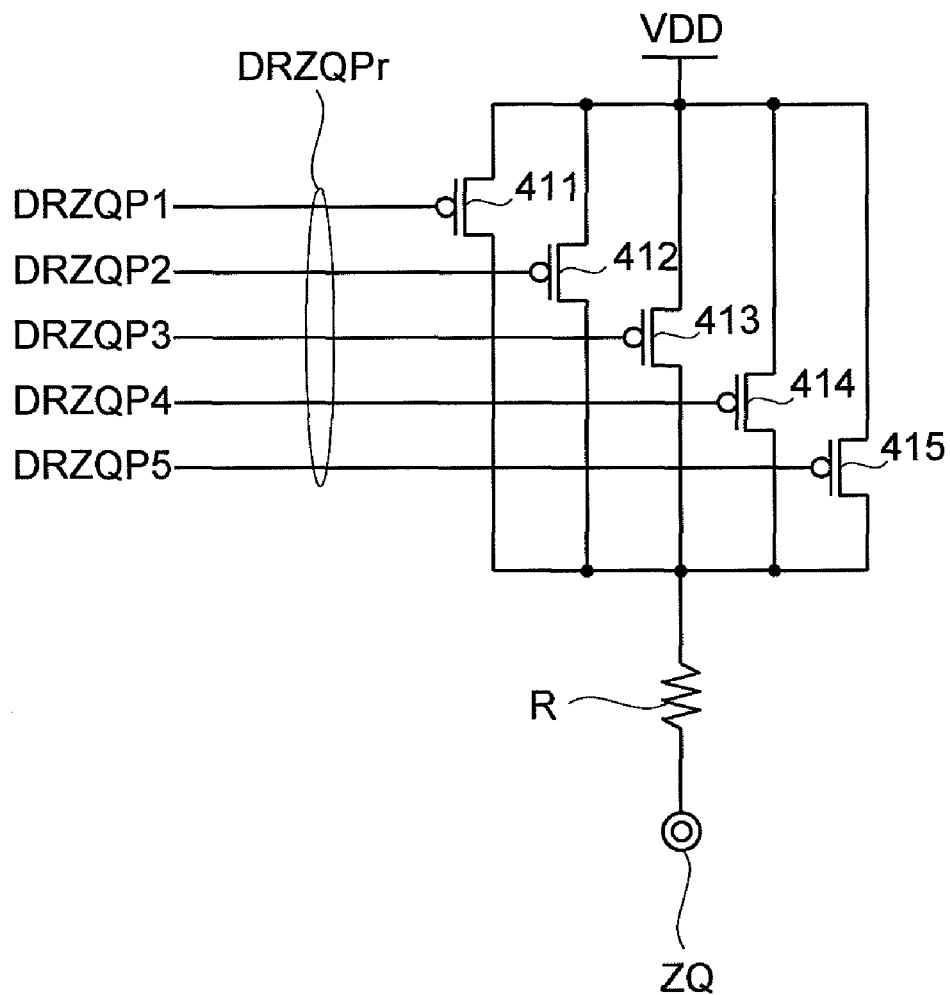
FIG. 5 is a first circuit diagram of the replica circuit.

FIG. 5 is a circuit diagram of the replica circuit 1441.

As shown in FIG. 5, the replica circuit 1441 is substantially the same in circuit configuration as the pull-up driver circuit 131 included in the output circuit 130 except that a drain of the replica circuit 1441 is connected to the calibration terminal ZQ. Specifically, the replica circuit 1441 is configured to include a plurality of (five in the first embodiment) P-channel MOS transistors 411 to 415 connected in parallel and the resistor R between the power supply potential VDD and the calibration terminal ZQ. The transistors 411 to 415 included in the replica circuit 1441 correspond to the transistors 211 to 215 shown in FIG. 3 and have the same impedances as those of the transistors 211 to 215, respectively. Nevertheless, as long as the replica circuit 1441 is substantially the same in impedance as the pull-up driver circuit 131, the transistors 411 to 415 included in the replica circuit 1441 are not necessarily exactly the same as the transistors 211 to 215 shown in FIG. 3 in transistor size. Alternatively, shrinking transistors can be used as constituent elements of the replica circuit 1441.

As shown in FIG. 1, the external resistor RE is connected to the calibration terminal ZQ. An impedance of the external resistor RE coincides with the impedances of the pull-up driver circuit 131 and pull-down driver circuit 132 constituting the output circuit 130. In other words, the external resistor RE having the same impedance as target impedances of the pull-up driver circuit 131 and pull-down driver circuit 132 is connected to the calibration terminal ZQ.

The counter circuit 1421 supplies the impedance control signals DRZQP1 to DRZQP5 to gates of the transistors 411 to 415, respectively, thereby controlling the replica circuit 1441. The impedance control signals DRZQP1 to DRZQP5 constitutes the impedance control signal DRZQPr shown in FIG. 2. The impedance control signal DRZQPr is basically the same signal as the impedance control signal DRZQPo shown in FIG. 4.

The replica circuit 1442 is the same in circuit configuration as the replica circuit 1441 shown in FIG. 5 except that a drain of the replica circuit 1442 is connected to a node A shown in FIG. 2. Accordingly, similarly to the replica circuit 1442, the counter circuit 1421 supplies the impedance control signals DRZQP1 to DRZQP5 to gates of five transistors included in the replica circuit 1442, respectively.

Figure 6:
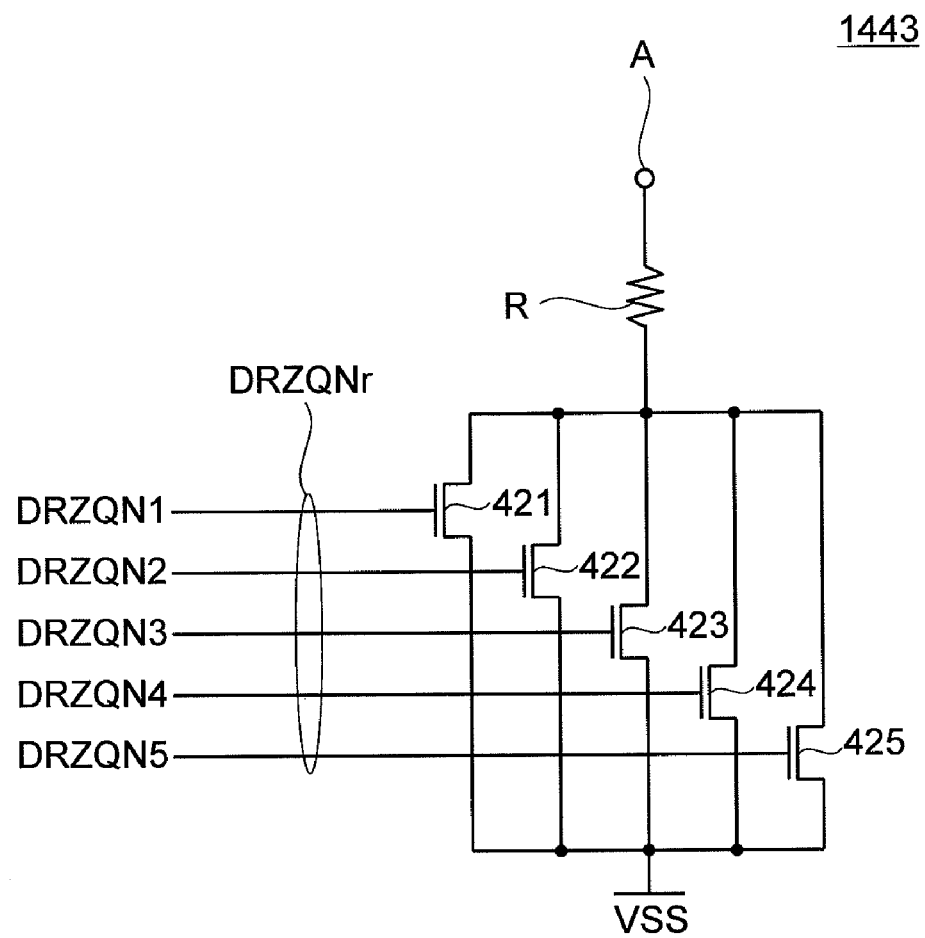
FIG. 6 is a second circuit diagram of the replica circuit.

FIG. 6 is a circuit diagram of the replica circuit 1443.

As shown in FIG. 6, the replica circuit 1443 is substantially the same in circuit configuration as the pull-down driver circuit 132 included in the output circuit 130 except that a drain of the replica circuit 1442 is connected to the node A. Specifically, the replica circuit 1443 is configured to include a plurality of (five in the first embodiment) N-channel MOS transistors 421 to 425 connected in parallel and the resistor R between the node A and the ground potential VSS. The transistors 421 to 425 included in the replica circuit 1443 correspond to the transistors 221 to 225 shown in FIG. 3 and have the same impedances as those of the transistors 221 to 225, respectively. Nevertheless, as long as the replica circuit 1443 is substantially the same in impedance as the pull-down driver circuit 132, the transistors 421 to 425 included in the replica circuit 1443 are not necessarily exactly the same as the transistors 221 to 225 shown in FIG. 3 in transistor size. Alternatively, shrinking transistors can be used as constituent elements of the replica circuit 1443.

The counter circuit 1422 supplies the impedance control signals DRZQN1 to DRZQN5 to gates of the transistors 421 to 425, respectively, thereby controlling the replica circuit 1443. The impedance control signals DRZQN1 to DRZQN5 constitutes the impedance control signal DRZQNr shown in FIG. 2. The impedance control signal DRZQNr is basically the same signal as the impedance control signal DRZQNo shown in FIG. 4.

Each of the reference voltage generation circuits 1451 and 1452 supplies a reference voltage to one of terminals of each of the comparison circuits 1461 and 1462, respectively. Specifically, the reference voltage generation circuits 1451 and 1452 supply the reference voltage that is half the power supply voltage VDD to the comparison circuits 1461 and 1462, respectively. Alternatively, it is possible to dispense with the reference voltage generation circuit 1452 and the reference voltage generation circuit 1451 can be configured to supply the reference voltage to the comparison circuits 1461 and 1462.

The comparison circuit 1461 compares a potential of the calibration terminal ZQ with the reference potential VDD/2 supplied from the reference voltage generation circuit 1451, and supplies a comparison result to the decision circuit 1471. A non-inverting input terminal (+) of the comparison circuit 1461 is connected to the calibration terminal ZQ whereas an inverting input terminal (−) thereof is connected to an output of the reference voltage generation circuit 1451.

As described above, the external resistor RE (of, for example, 240Ω) is connected to the calibration terminal ZQ. Therefore, the calibration terminal ZQ corresponds to a contact between the replica circuit 1441 and the external resistor RE. When the potential of the calibration terminal ZQ is higher than the reference potential VDD/2, that is, an impedance of the replica circuit 1441 is lower than that of the external resistor RE, the comparison circuit 1461 sets a comparison signal COMP1 to high level. When the potential of the calibration terminal ZQ is lower than the reference potential VDD/2, that is, the impedance of the replica circuit 1441 is higher than that of the external resistor RE, the comparison circuit 1461 sets the comparison signal COMP1 to low level.

The comparison circuit 1462 compares a potential of the node A that is a contact between the replica circuits 1442 and 1443 with the reference potential VDD/2 supplied from the reference voltage generation circuit 1452, and supplies a comparison result to the decision circuit 1472. A non-inverting input terminal (+) of the comparison circuit 1462 is connected to the contact A whereas an inverting input terminal (−) thereof is connected to an output of the reference voltage generation circuit 1452. When the potential of the contact A is higher than the reference potential VDD/2, that is, an impedance of the replica circuit 1443 is higher than that of the replica circuit 1442, the comparison circuit 1462 sets a comparison signal COMP2 to high level. On the other hand, when the potential of the contact A is lower than the reference potential VDD/2, that is, the impedance of the replica circuit 1443 is lower than that of the replica circuit 1442, the comparison circuit 1462 sets the comparison signal COMP2 to low level.

The decision circuits 1471 and 1472 detect change patterns of logic levels of the comparison signals COMP1 and COMP2, and activate the hit signals hit1 and hit2 when the logic levels of the comparison signals COMP1 and COMP2 change in predetermined change patterns, respectively. The hit signals hit1 and hit2 are supplied to the impedance adjustment control circuit 141. When the hit signal hit1 is activated, the impedance adjustment control circuit 141 stops supplying the impedance control clock signal CLK1(a) to the counter circuit 1421. When the hit signal hit2 is activated, the impedance adjustment control circuit 141 stops supplying the impedance control clock signal CLK2(a) to the counter circuit 1422. The decision circuits 1471 and 1472 supply comparison signals JCOMP1 and JCOMP2 to the counter circuits 1421 and 1422, respectively. Note that the signals JCOMP1 and JCOMP2 are identical to the comparison signals COMP1 and COMP2, respectively.

Figure 7:
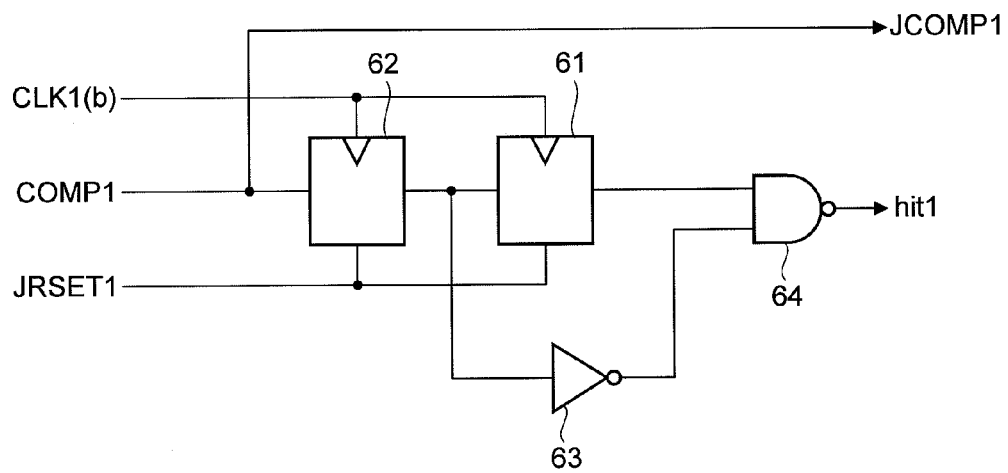
FIG. 7 is a circuit diagram of the decision circuits.
Figure 7:
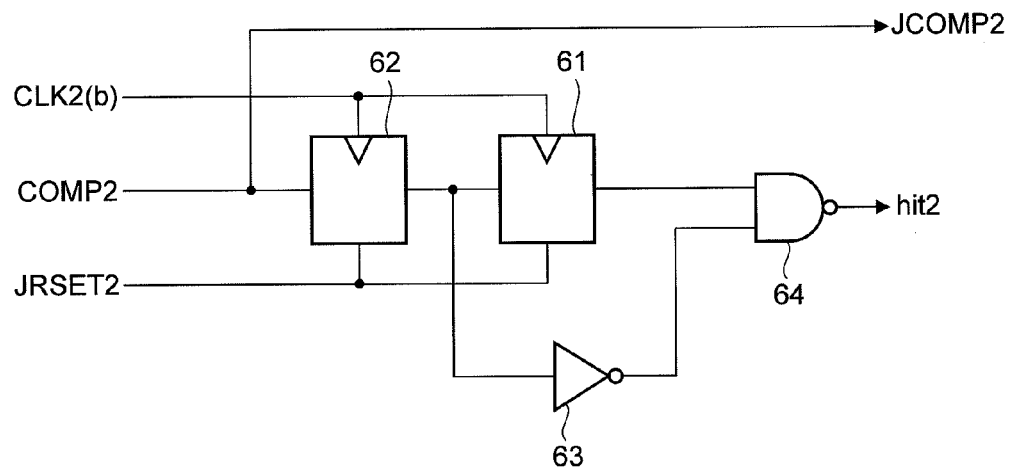

FIG. 7 is a circuit diagram of the decision circuits 1471 and 1472.

As shown in FIG. 7, the decision circuits 1471 and 1472 are the same in circuit configuration. Each of the decision circuits 1471 and 1472 includes two flip-flop circuits 61 and 62 cascaded to each other, an inverter circuit 63, and a NAND circuit 64. By so configuring as shown in FIG. 7, the decision circuits 1471 and 1472 change the hit signals hit1 and hit2 to low level that is an active state according to changes of the comparison signals COMP1 and COMP2 from the high level to the low level, respectively. That is, the decision circuit 1471 activates the hit signal hit1 only when the impedance of the replica circuit 1441 changes from a state where the impedance of the replica circuit 1441 is lower than that of the external resistor RE to a state where the impedance thereof is higher than that of the external resistor RE. The decision circuit 1472 activates the hit signal hit2 only when the impedance of the replica circuit 1443 changes from a state where the impedance of the replica circuit 1443 is higher than that of the replica circuit 1442 to a state where the impedance thereof is lower than that of the replica circuit 1442. When the impedance adjustment control circuit 141 inputs the reset signals JRSET1 and JRSET2 to the decision circuits 1471 and 1472, the decision circuits 1471 and 1472 reset data held in the flip-flop circuits 61 and 62 to low level, respectively.

Figure 8:
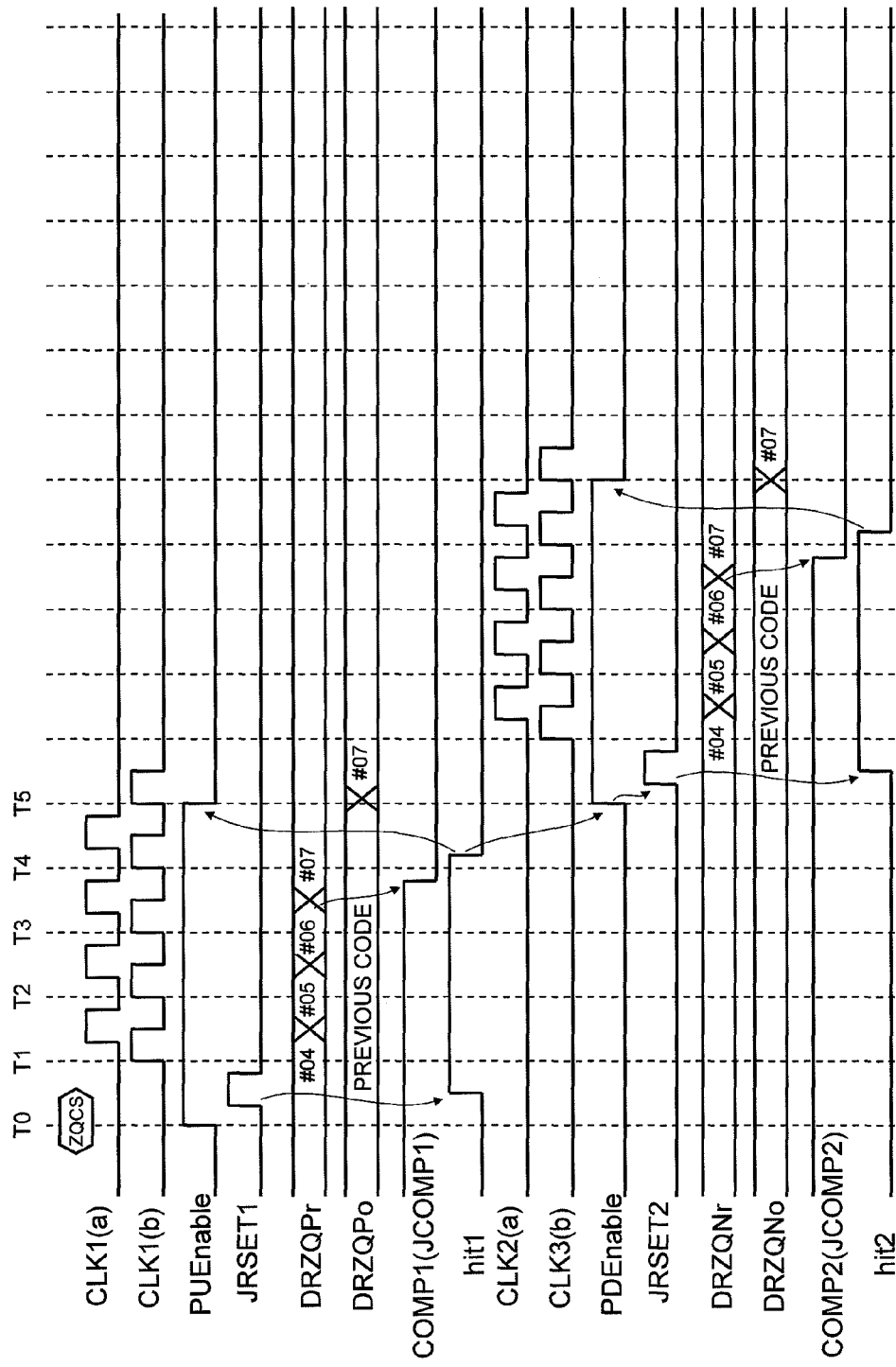
FIG. 8 is a waveform view showing an operation performed by the impedance control circuit according to the first embodiment.

FIG. 8 is a waveform view showing an operation performed by the impedance control circuit 140 according to the first embodiment.

At a time T0, when the pull-up enable signal PUEnable is activated in response to the calibration command (ZQCS), the reset signal JRSET1 is activated (T0 to T1). The flip-flop circuits 61 and 62 included in the decision circuit 1471 are reset according to pulses of the reset signal JRSET1. At this time, the comparison signal COMP1 is high level in an example shown in FIG. 8.

The counter circuit 1421 counts up a count value synchronously with the impedance control clock CLK1(a) in response to the high-level comparison signal COMP1. The counter circuit 1421 thereby counts up the count value from the previous count value (#4→#5→#6). If the count value of the counter circuit 1421 is greater, a value of the impedance control signal DRZQPr changes accordingly and the impedance of the replica circuit 1441 increases.

In the example shown in FIG. 8, at a time when the counter circuit 1421 counts up the count value up to #7, the impedance of the replica circuit 1441 exceeds that of the external resistor RE and the comparison signal COMP1 thereby changes from the high level to low level. As a result, the decision circuit 1471 activates the hit signal hit1 to low level synchronously with the impedance control clock CLK1(b).

In response to activation of the hit signal hit1, the impedance adjustment control circuit 141 stops supplying the impedance control clock CLK1(a) to the counter circuit 1421, deactivates the pull-up enable signal PUEnable, and activates instead the pull-down enable signal PDEnable. Further, the impedance adjustment control circuit 141 activates the reset signal JRSET2. The flip-flop circuits 61 and 62 included in the decision circuit 1472 are reset according to pulses of the reset signal JRSET2. At this time, the comparison signal COMP2 is high level in the example shown in FIG. 8.

The counter circuit 1422 counts up a count value synchronously with the impedance control clock CLK2(a) in response to the high-level comparison signal COMP2. The counter circuit 1422 thereby counts up the count value from the previous count value (#4→#5→#6). If the count value of the counter circuit 1422 is greater, a value of the impedance control signal DRZQNr changes accordingly and the impedance of the replica circuit 1443 decreases.

In the example shown in FIG. 8, at a time when the counter circuit 1422 counts up the count value up to #7, the impedance of the replica circuit 1443 falls below those of the replica circuits 1441 and 1442 and the comparison signal COMP2 thereby changes from the high level to low level. As a result, the decision circuit 1472 activates the hit signal hit2 to low level synchronously with the impedance control clock CLK2(b).

In response to activation of the hit signal hit2, the impedance adjustment control circuit 141 stops supplying the impedance control clock CLK2(a) to the counter circuit 1422, and deactivates the pull-down enable signal PDEnable. Further, the impedance adjustment control circuit 141 activates the reset signal JRSET2.

In the first embodiment, the pull-up enable signal PUEnable is activated in response to the calibration command ZQCS. Alternatively, the pull-up enable signal PUEnable can be made active in response to the calibration command ZQCS only at start of first impedance control, and the pull-up enable signal PUEnable can be made active in response to activation of the hit signal hit2 during second and following calibrations. By so configuring, there is no need to input the calibration command to the impedance adjustment control circuit 141 from the outside during a second and the following impedance control, thereby advantageously improving command utilization efficiency.

Figure 9:
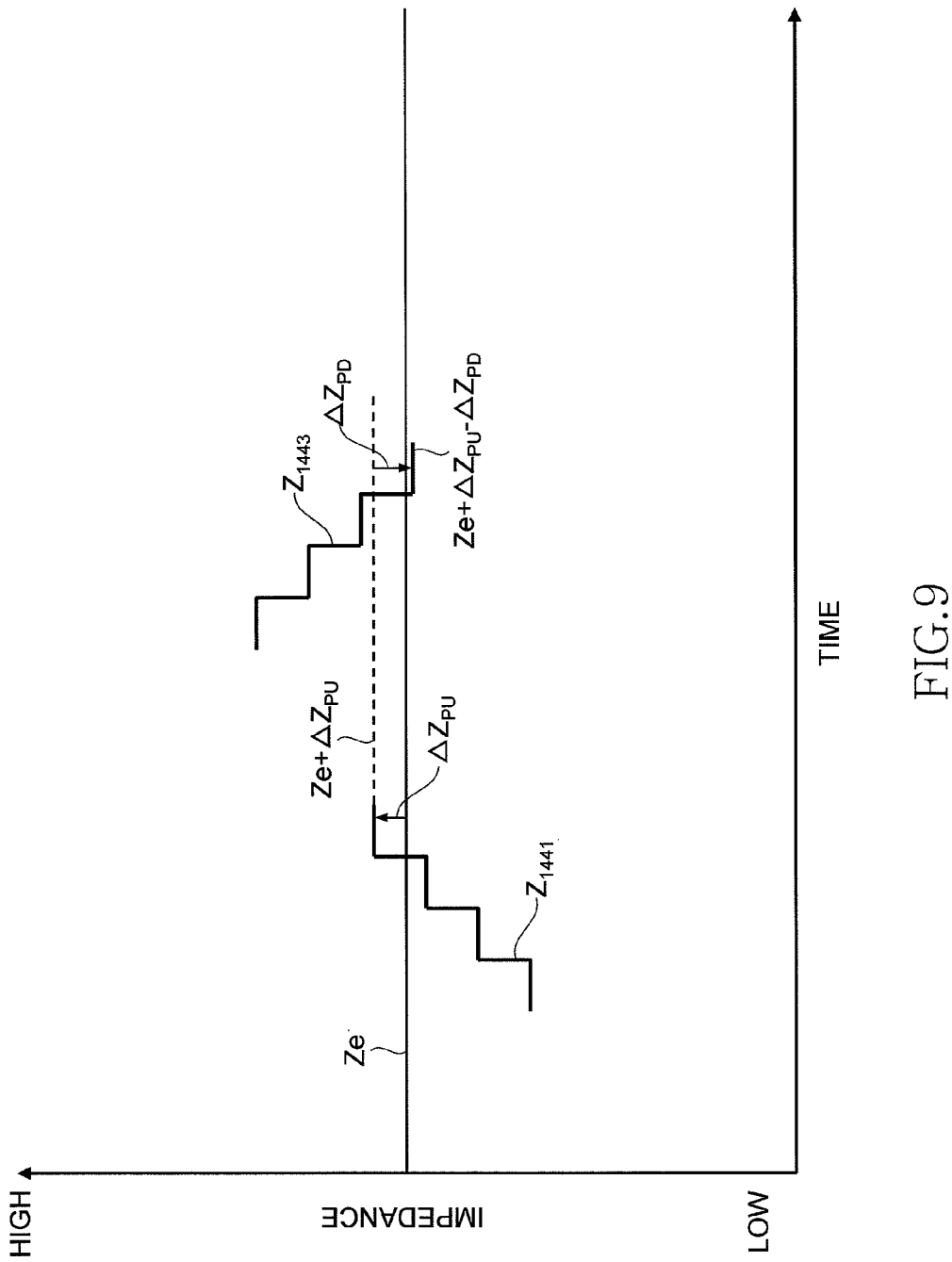
FIG. 9 is a first chart schematically showing changes of the impedances of the replica circuits that are being subjected to impedance control in the first embodiment.

FIG. 9 is a chart schematically showing changes of the impedances of the replica circuits 1441 and 1443 that are being subjected to impedance control in the first embodiment. A line $Z_{1441}$ indicates the change of the impedance of the pull-up replica circuit 1441 and a line $Z_{1443}$ indicates the change of the impedance of the pull-down replica circuit 1443.

As shown in FIG. 9, when impedance control is performed so that the impedance $Z_{1441}$ of the replica circuit 1441 is close to the impedance Ze of the external resistor RE from a state where the impedance $Z_{1441}$ is lower than the impedance Ze, the impedance $Z_{1441}$ is higher than the impedance Ze of the external resistor RE by a adjust error $\Delta Z_{PU}$ ($Z_{1441}$=Ze+$\Delta Z_{PU}$). When next impedance control of the impedance $Z_{1443}$ of the pull-down replica circuit 1443 starts from a state where the impedance $Z_{1443}$ is higher than the target impedance Ze+$\Delta Z_{PU}$ including the adjust error $\Delta Z_{PU}$, the impedance of the replica circuit 1443 after the impedance control is lower than the target impedance Ze+$\Delta Z_{PU}$ by an adjust error $\Delta Z_{PD}$ ($Z_{1443}$=Ze+$\Delta Z_{PU}$-$\Delta Z_{PD}$).

In this way, the adjust error $\Delta Z_{PU}$ generated on the replica circuit 1441 side and the adjust error $\Delta Z_{PD}$ generated on the replica circuit 1443 side cancel each other. This can prevent phenomenon that the pull-down replica circuit has a greater adjust error than that of the pull-up replica circuit as shown in the conventional impedance control circuit. Specifically, the adjust error of each of the pull-up and pull-down replica circuits 1441 and 1443 can be suppressed up to one bit of the count value.

There has been described an example in which the impedance $Z_{1441}$ of the replica circuit 1441 starts from the state of being lower than the impedance Ze of the external resistor RE and in which the impedance $Z_{1443}$ of the replica circuit 1443 starts from the state of being higher than the impedance Ze+$\Delta Z_{PU}$ of the replica circuit 1441. However, identical effects can be achieved in other cases.

Figure 10:
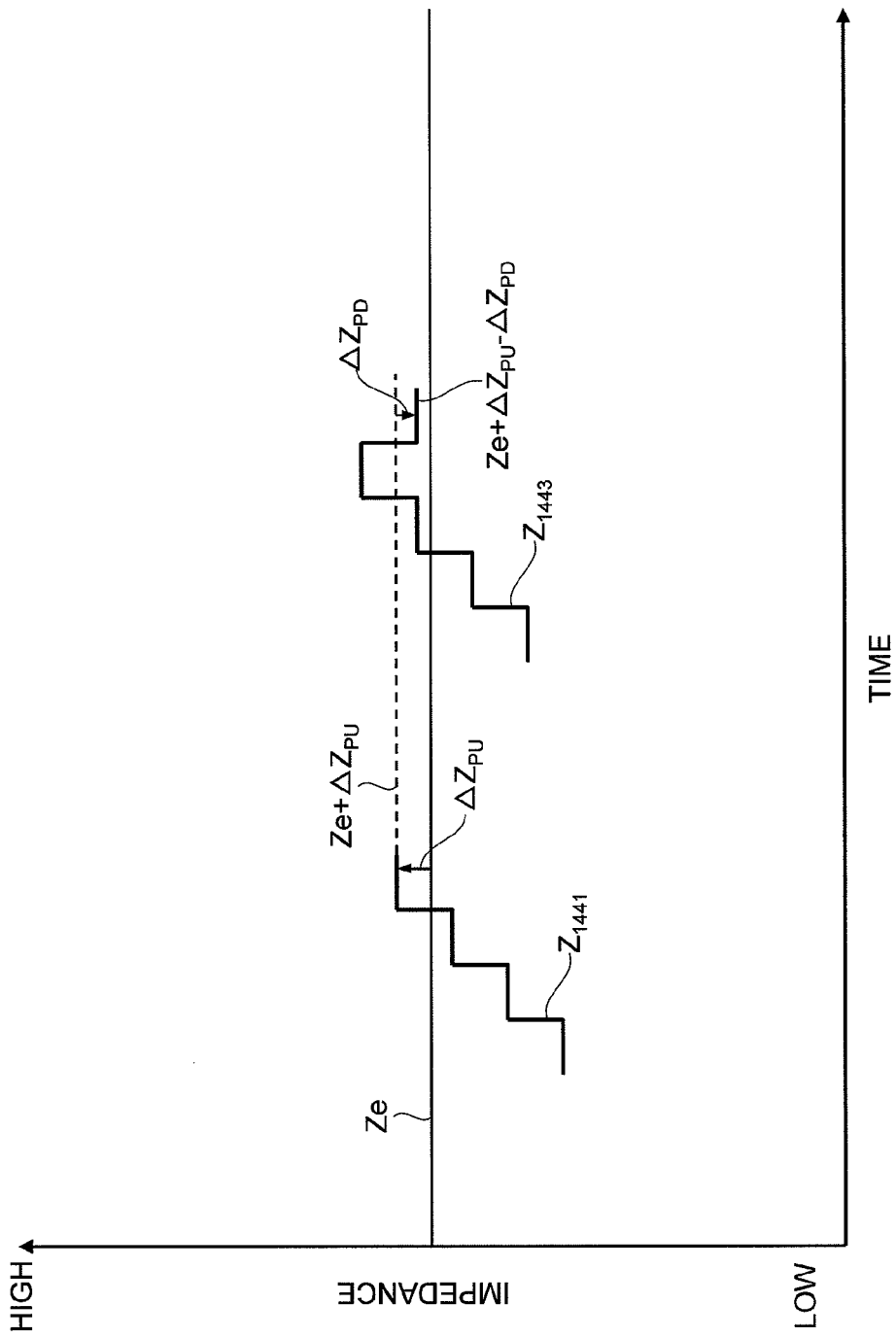
FIG. 10 is a second chart schematically showing changes of the impedances of the replica circuits that are being subjected to impedance control in the first embodiment.

FIG. 10 is a chart showing an example in which the impedance $Z_{1441}$ of the replica circuit 1441 starts from the state of being lower than the impedance Ze of the external resistor RE and in which the impedance $Z_{1443}$ of the replica circuit 1443 starts from the state of being lower than the impedance Ze+$\Delta Z_{PU}$ of the replica circuit 1441.

In the example shown in FIG. 10, it is necessary for the impedance $Z_{1443}$ of the pull-down replica circuit 1443 to exceed the target impedance Ze+$\Delta Z_{PU}$ twice (the impedance $Z_{1443}$ exceeds the target impedance at the first time and falls below the target impedance at the second time). Nevertheless, the finally obtained impedance of the replica circuit 1443 is lower than the target impedance Ze+$\Delta Z_{PU}$ by the adjust error $\Delta Z_{PD}$, that is, $Z_{1443}$=Ze+$\Delta Z_{PU}$-$\Delta Z_{PD}$. Therefore, it is possible to achieve the same effect as that achieved in the example shown in FIG. 9.

The same is true for all the other examples, and the adjust error of each of the pull-up and pull-down replica circuits 1441 and 1443 can be suppressed up to one bit of the count value.

However, the impedance control circuit 140 according to the first embodiment is slightly susceptible to influence of noise and possibly malfunctions due to noise. This drawback is described below.

FIGS. 11A and 11B are tables showing changes of values of the flip-flop circuits 61 and 62 included in the decision circuit 1471. Specifically, FIG. 11A shows a case of no influence of noise on the impedance control circuit 140, and FIG. 11B shows a case of influence of noise on the impedance control circuit 140.

As shown in FIG. 11A, after resetting the flip-flop circuits 61 and 62, the impedance of the replica circuit 1441 gradually increases as the counter circuit 1421 counts up the count value. As a result, the value of the flip-flop circuit 62 is turned into high level at a time t11, and the values of both the flip-flop circuits 61 and 62 are turned into high level at a time t12. Thereafter, the counter circuit 1421 continues counting up the count value, whereby the impedance of the replica circuit 1441 is higher than the impedance Ze of the external resistor RE. As a result, at a time t15, the values of the flip-flop circuits 61 and 62 are turned into high level and low level, respectively. The hit signal hit1 is thereby activated and the impedance control of the replica circuit 1441 is completed. This operation is a normal operation when the impedance control circuit 140 has no influence of noise.

On the other hand, as shown in FIG. 11B, when the output of the reference voltage generation circuit 1451 changes due to the influence of noise and the output of the comparison circuit 1461 at a time t13 is inverted from the high level to the low level accordingly, then the values of the flip-flop circuits 61 and 62 are turned into high level and low level at the time t13, respectively, thereby erroneously activating the hit signal hit1. That is, an impedance control operation ends although the impedance of the replica circuit 1441 does not reach the impedance Ze of the external resistor RE yet.

This problem is highly likely to occur particularly in a state where the difference between an output level of the replica circuit 1441 and that of the reference voltage generation circuit 1451 is small and the output of the comparison circuit 1461 thereby tends to be inverted, that is, just before end of the impedance control. Needless to say, this problem also occurs to the impedance control operation by the pull-down replica circuit 1443.

A second embodiment according to the present invention described next is an example in which an impedance control circuit is configured to make it difficult to influence noise on an impedance control circuit.

The overall configuration of the impedance control circuit according to the second embodiment is not shown herein. However, the impedance control circuit according to the second embodiment is different from the impedance control circuit 140 according to the first embodiment such that decision circuits 2471 and 2472 are used instead of the decision circuits 1471 and 1472 shown in FIG. 2, respectively.

Figure 13:
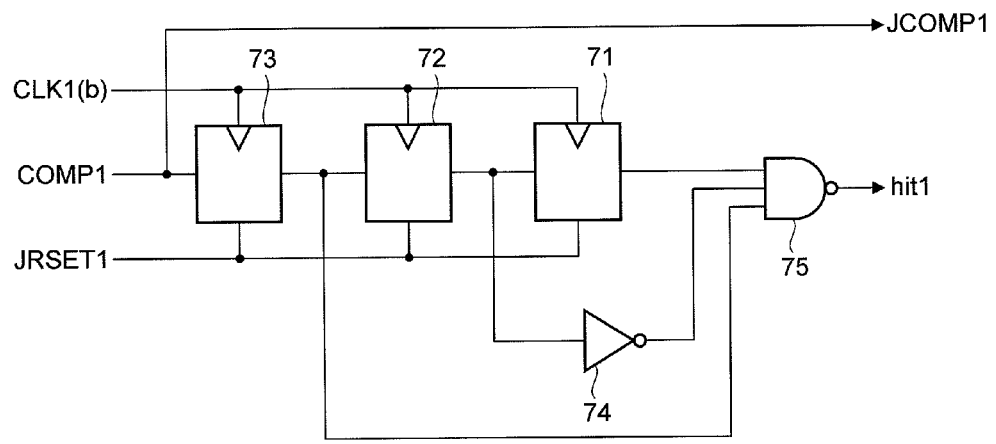
FIG. 13 is a second circuit diagram of the decision circuits according to the second embodiment.
Figure 13:
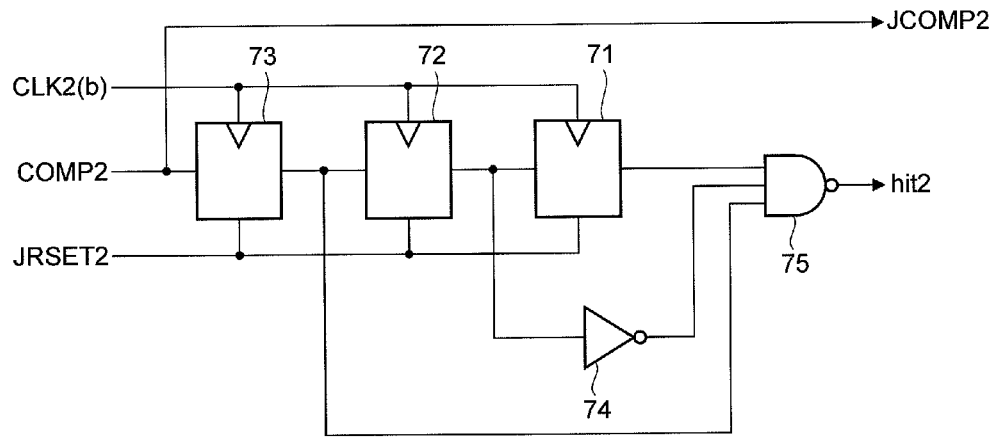

FIG. 13 is a circuit diagram of the decision circuits 2471 and 2472.

As shown in FIG. 13, the decision circuits 2471 and 2472 are the same in circuit configuration. Each of the decision circuits 2471 and 2472 includes three flip-flop circuits 71 to 73 cascaded to one another, an inverter circuit 74, and a NAND circuit 75. By so configuring as shown in FIG. 13, the decision circuits 2471 and 2472 change the hit signals hit1 and hit2 to low level that is an active state according to changes of the comparison signals COMP1 and COMP2 to high level, low level, and high level in this order, respectively.

That is, the decision circuit 2471 activates the hit signal hit1 only when the impedance of the replica circuit 1441 changes continuously to the state where the impedance of the replica circuit 1441 is lower than that of the external resistor RE, the state where the impedance thereof is higher than that of the external resistor RE, and the state where the impedance thereof is lower than that of the external resistor RE. The decision circuit 2472 activates the hit signal hit2 only if the impedance of the replica circuit 1443 changes to the state where the impedance of the replica circuit 1443 is higher than that of the replica circuit 1442, the state where the impedance thereof is lower than that of the replica circuit 1442, and the state where the impedance thereof is higher than that of the replica circuit 1442. When the impedance adjustment control circuit 141 inputs the reset signals JRSET1 and JRSET2 to the decision circuits 2471 and 2472, the decision circuits 2471 and 2472 reset data held in the flip-flop circuits 71 to 73 to low level, respectively.

Figure 14:
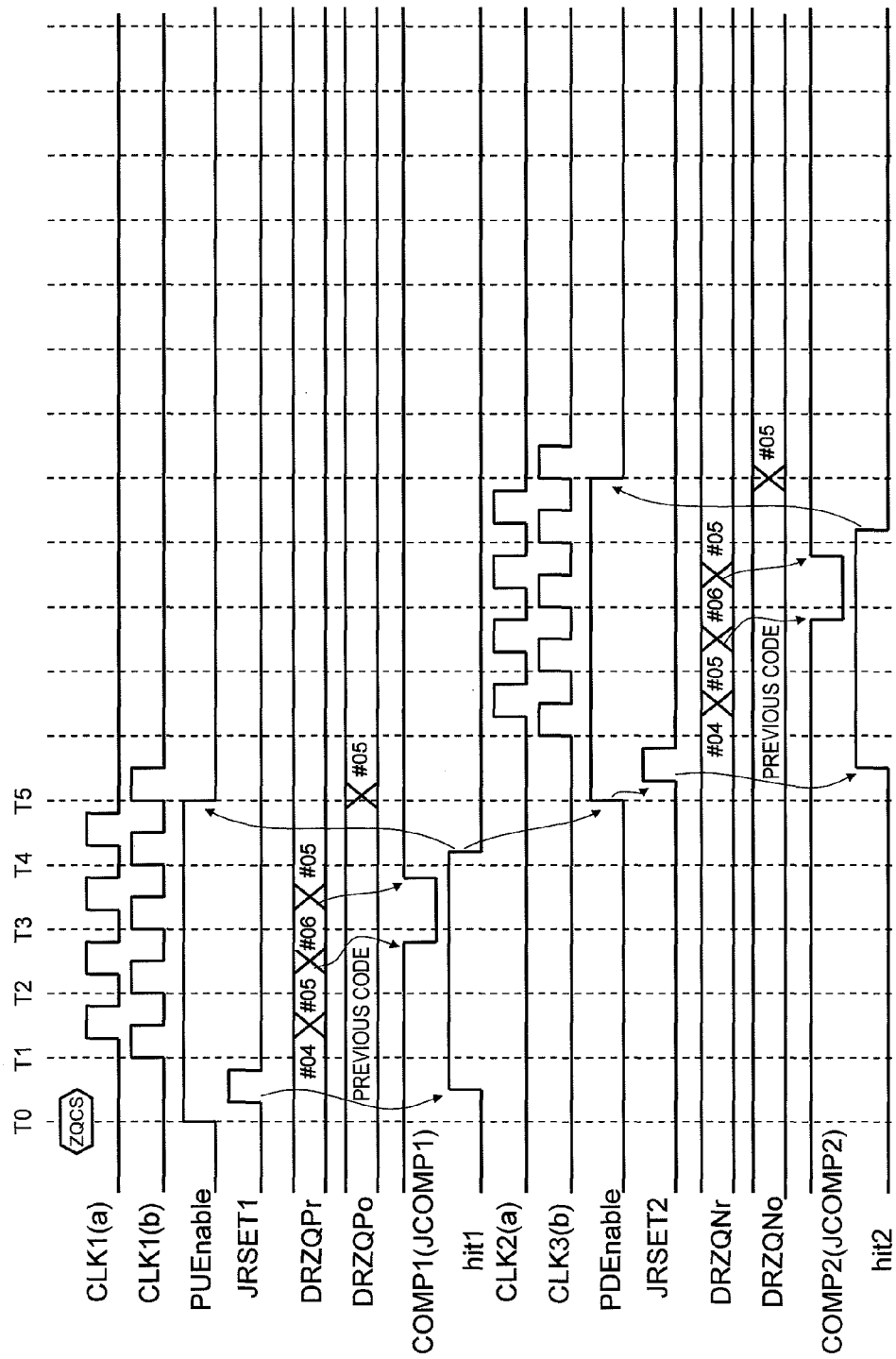
FIG. 14 is a waveform view showing an operation by the impedance control circuit according to the second embodiment.

FIG. 14 is a waveform view showing an operation by the impedance control circuit 140 according to the second embodiment.

First, at the time T0, the pull-up enable signal PUEnable is activated in response to the calibration command (ZQCS) and at the same time, the reset signal JRSET1 is activated (T0 to T1). The flip-flop circuits 71 to 73 included in the decision circuit 2471 are reset according to pulses of the reset signal JRSET1. At this time, the comparison signal COMP1 is high level in an example shown in FIG. 14.

The counter circuit 1421 counts up the count value synchronously with the impedance control clock CLK1(a) in response to the high-level comparison signal COMP1. The counter circuit 1421 thereby counts up the count value from the previous count value (#4→#5→#6). If the count value of the counter circuit 1421 is greater, the value of the impedance control signal DRZQPr changes accordingly and the impedance of the replica circuit 1441 increases.

In the example shown in FIG. 14, at a time when the counter circuit 1421 counts up the count value up to #6, the impedance of the replica circuit 1441 exceeds that of the external resistor RE and the comparison signal COMP1 thereby changes from the high level to low level. Due to this, the counter circuit 1421 counts down the next count value to #5. As a result, the flip-flop circuits 71 to 73 included in the decision circuit 2471 are turned into high, low, and high levels, respectively. The decision circuit 2471, therefore, activates the hit signal hit1 to low level synchronously with the impedance control clock CLK1(b).

In response to activation of the hit signal hit1, the impedance adjustment control circuit 141 stops supplying the impedance control clock CLK1(a) to the counter circuit 1421, deactivates the pull-up enable signal PUEnable, and activates instead the pull-down enable signal PDEnable. Further, the impedance adjustment control circuit 141 activates the reset signal JRSET2. The flip-flop circuits 71 to 73 included in the decision circuit 2472 are reset according to pulses of the reset signal JRSET2. At this time, the comparison signal COMP2 is high level in the example shown in FIG. 14.

The counter circuit 1422 counts up the count value synchronously with the impedance control clock CLK2(a) in response to the high-level comparison signal COMP2. The counter circuit 1422 thereby counts up the count value from the previous count value (#4→#5→#6). If the count value of the counter circuit 1422 is greater, the value of the impedance control signal DRZQNr changes accordingly and the impedance of the replica circuit 1443 decreases.

In the example shown in FIG. 14, at a time when the counter circuit 1422 counts up the count value up to #6, the impedance of the replica circuit 1443 falls below those of the replica circuits 1441 and 1442 and the comparison signal COMP2 thereby changes from the high level to low level. As a result, the flip-flop circuits 71 to 73 included in the decision circuit 2472 are turned into high, low, and high levels, respectively. The decision circuit 2472, therefore, activates the hit signal hit2 to low level synchronously with the impedance control clock CLK2(b).

In response to activation of the hit signal hit2, the impedance adjustment control circuit 141 stops supplying the impedance control clock CLK2(a) to the counter circuit 1422, and deactivates the pull-down enable signal PDEnable. Further, the impedance adjustment control circuit 141 activates the reset signal JRSET2.

Figure 15:
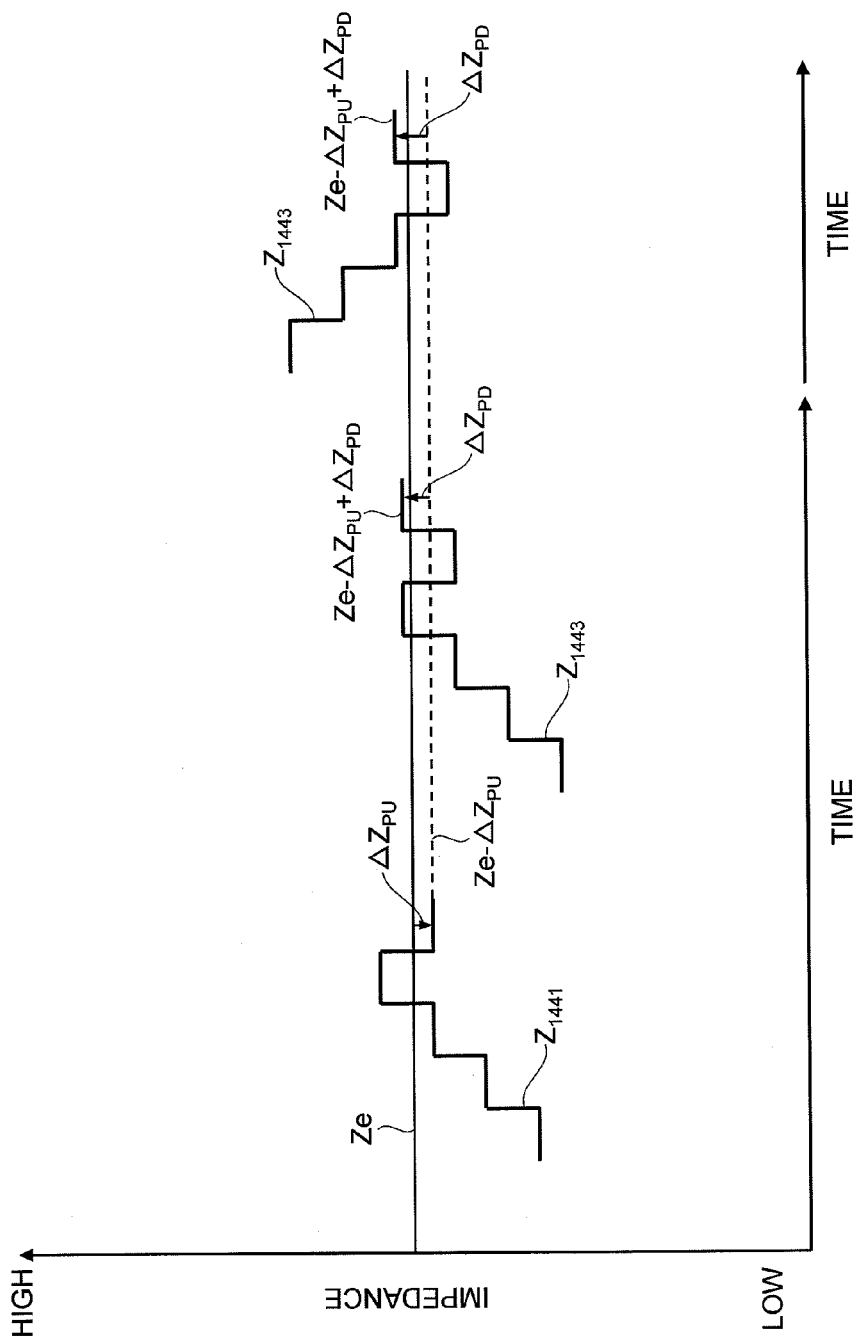
FIG. 15 is a chart schematically showing changes of the impedances of the replica circuits that are being subjected to impedance control in the second embodiment.

FIG. 15 is a chart schematically showing changes of the impedances of the replica circuits 1441 and 1443 that are being subjected to impedance control in the second embodiment.

As shown in FIG. 15, in the second embodiment, the impedance control is completed when the impedances of each of the pull-up replica circuit 1441 and the pull-down replica circuit 1443 exceeds the target impedance two or three times. Whether the number (two or three) of times when the impedance of each of the pull-up replica circuit 1441 and the pull-down replica circuit 1443 exceeds the target impedance depends on the impedance at start of the impedance control.

To specifically explain, FIG. 15 shows an example in which the impedance control is completed when the impedance $Z_{1441}$ of the pull-up replica circuit 1441 exceeds the target impedance Ze twice (the impedance $Z_{1441}$ exceeds the target impedance Ze at the first time and falls below the target impedance at the second time). The obtained impedance is Ze−$\Delta Z_{PU}$. FIG. 15 also shows an example in which the impedance control is completed when the impedance $Z_{1443}$ of the pull-up replica circuit 1443 exceeds the target impedance Ze−$\Delta Z_{PU}$ twice (the impedance $Z_{1443}$ falls below the target impedance Ze−$\Delta Z_{PU}$ at the first time and exceeds the target impedance at the second time). Further, FIG. 15 shows an example in which the impedance control is completed when the impedance $Z_{1443}$ of the pull-up replica circuit 1443 exceeds the target impedance Ze−$\Delta Z_{PU}$ three times (the impedance $Z_{1443}$ exceeds the target impedance Ze−$\Delta Z_{PU}$ at the first time, falls below the target impedance at the second time, and exceeds the target impedance at the third time). The obtained impedance is higher than the target impedance Ze−$\Delta Z_{PU}$ by the adjust error $\Delta Z_{PD}$, that is, $Z_{1443}$=Ze−$\Delta Z_{PU}$+$\Delta Z_{PD}$. This means that the adjust errors cancel each other.

In this way, in the second embodiment, the control is completed when the impedances of the replica circuits 1441 and 1443 exceed the target impedances two or three times. As a result, even when the output of the reference voltage generation circuit 1451 changes due to noise, the impedance control can be performed one more time than that in the first embodiment. The impedance control circuit according to the second embodiment is less susceptible to the influence of noise than the impedance control circuit 140 according to the first embodiment.

Figure 16:
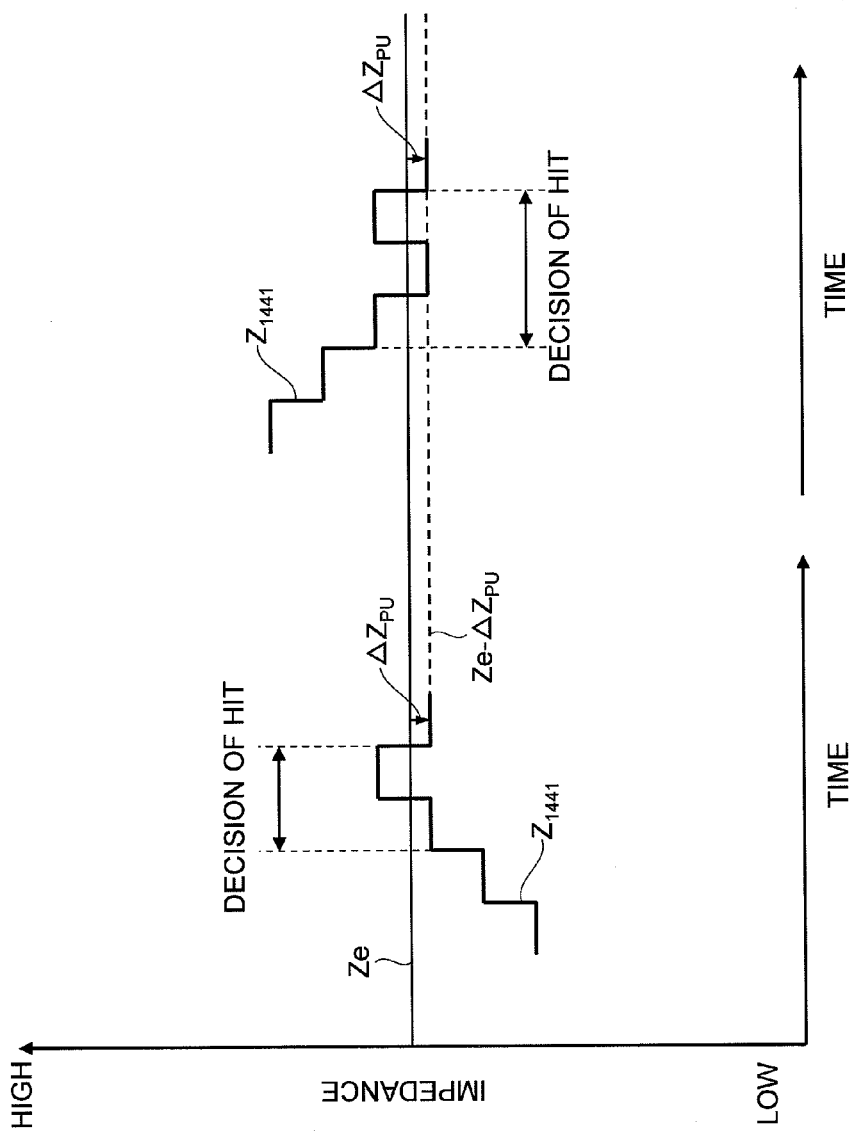
FIG. 16 is a chart for explaining the problem in the second embodiment.

In the second embodiment, the impedance control circuit configured to activate the hit signal hit1 only if the impedance of the replica circuit 1441 continuously changes to the state of being lower than that of the external resistor RE, the state of being higher than that of the external resistor RE, and the state of being lower than that of the external resistor RE. Due to this, as shown in FIG. 16, the number of changes of the impedance striding over the target impedance when the impedance of the replica circuit 1441 at start of the impedance control is higher than that of the external resistor RE is larger than that when the impedance of the replica circuit 1441 at start of the impedance control is lower than that of the external resistor RE. As a result, when the impedance of the replica circuit 1441 at start of the impedance control is higher than that of the external resistor RE, a longer time is required to make hit determination than when the impedance of the replica circuit 1441 at the start of the impedance control is lower. The time required to make hit determination means a time since the impedance of the replica circuit reaches a state just before striding over the target impedance for the first time until the hit signal is activated (see FIG. 16).

A third embodiment according to the present invention is intended to solve the problems described above. That is, the third embodiment is an embodiment of an impedance control circuit that makes the time required for hit determination constant regardless of whether the impedance of the replica circuit 1441 at start of the impedance control is higher or lower than that of the external resistor RE.

The overall configuration of the impedance control circuit according to the third embodiment is not shown herein. However, the impedance control circuit according to the third embodiment is different from the impedance control circuit 140 according to the first embodiment such that a decision circuit 347 is used instead of the decision circuits 1471 and 1472 shown in FIG. 2.

Figure 17:
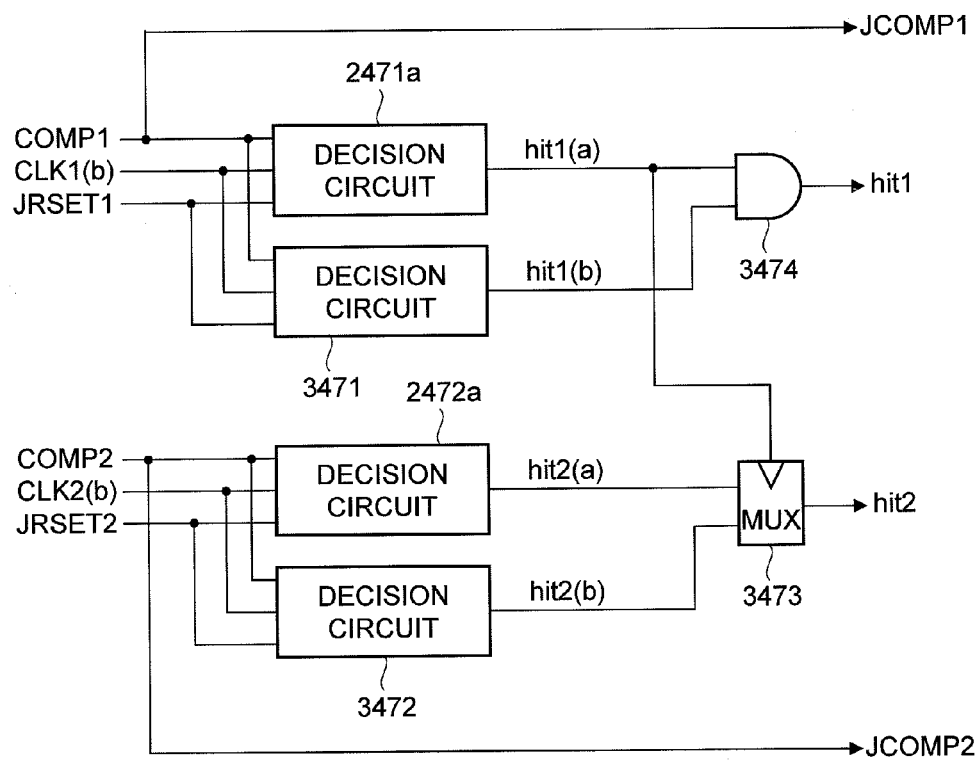
FIG. 17 is a first circuit diagram of the decision circuit according to the third embodiment.

FIG. 17 is a circuit diagram of the decision circuit 347.

As shown in FIG. 17, the decision circuit 347 includes decision circuits 2471a, 3471, 2472a, and 3472, a switch unit 3473, and an AND circuit 3474. The decision circuits 2471a and 2472a are configured to eliminate output paths of the comparison signals JCOMP1 and JCOMP2 from the decision circuits 2471 and 2472 shown in FIG. 13, respectively.

Figure 18:
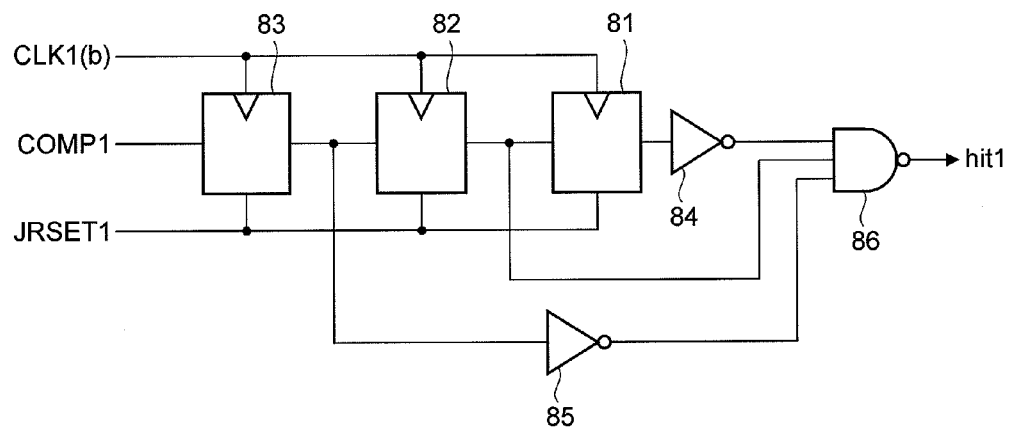
FIG. 18 a second circuit diagram of the decision circuit according to the third embodiment.
Figure 18:
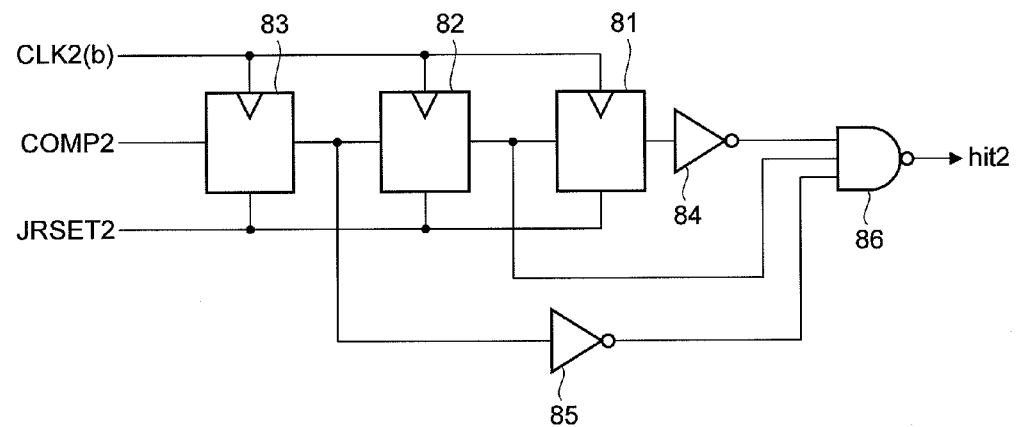

FIG. 18 is a circuit diagram of the decision circuits 3471 and 3472.

As shown in FIG. 18, the decision circuits 3471 and 3472 are the same in circuit configuration. Each of the decision circuits 3471 and 3472 includes three flip-flop circuits 81 to 83 cascaded to one another, inverter circuits 84 and 85, and a NAND circuit 86. By so configuring as shown in FIG. 18, the decision circuits 3471 and 3472 change the hit signals hit1 and hit2 to low level that is an active state according to changes of the comparison signals COMP1 and COMP2 to high level, low level, and high level in this order, respectively.

That is, the decision circuit 3471 activates the hit signal hit1 only when the impedance of the replica circuit 1441 changes continuously to the state where the impedance of the replica circuit 1441 is higher than that of the external resistor RE, the state where the impedance thereof is lower than that of the external resistor RE, and the state where the impedance thereof is higher than that of the external resistor RE. The decision circuit 3472 activates the hit signal hit2 only when the impedance of the replica circuit 1443 changes to the state where the impedance of the replica circuit 1443 is lower than that of the replica circuit 1442, the state where the impedance thereof is higher than that of the replica circuit 1442, and the state where the impedance thereof is lower than that of the replica circuit 1442. When the impedance adjustment control circuit 141 inputs the reset signals JRSET1 and JRSET2 to the decision circuits 3471 and 3472, the decision circuits 3471 and 3472 reset data held in the flip-flop circuits 81 to 83 to low level, respectively.

Referring back to FIG. 17, the switch unit 3473 switches over between a hit signal hit2(a) output from the decision circuit 2472a and a hit signal hit2(b) output from the decision circuit 3472 according to a logic level of a hit signal hit1(a) output from the decision circuit 2471a. Specifically, when the hit signal hit1(a) is low level, the hit signal hit2(a) is output as the hit signal hit2. When the hit signal hit1(a) is high level, the hit signal 2(b) is output as the hit signal hit2.

The AND circuit 3474 outputs the low-level (active) hit signal hit1 when one of the hit signal hit1(a) output from the decision circuit 2471a and the hit signal hit1(b) output from the decision circuit 3471 is low level (active), and outputs the high-level (inactive) hit signal hit1 when both the hit signals hit1(a) and hit1(b) are high level (inactive).

Figure 19:
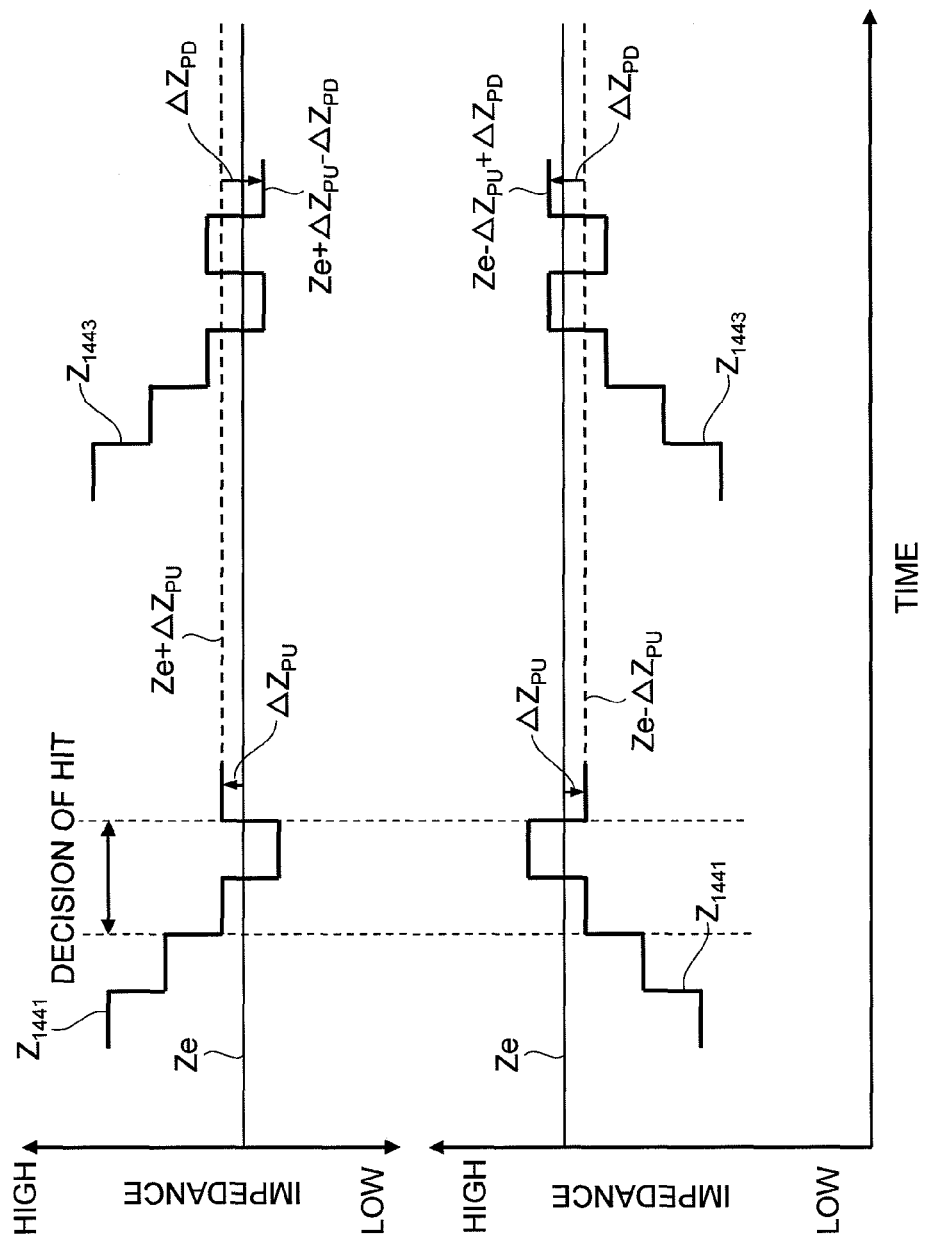
FIG. 19 is a chart schematically showing changes of the impedances of the replica circuits that are being subjected to impedance control according to a third embodiment.

FIG. 19 is a chart schematically showing changes of the impedances of the replica circuits 1441 and 1443 that are being subjected to impedance control according to a third embodiment of the present invention.

As shown in FIG. 19, in the third embodiment, the hit signal hit1 is activated when the impedance of the replica circuit 1441 changes continuously to the state of being lower than that of the external resistor RE, the state of being higher than that of the external resistor RE, and the state of being lower than that of the external resistor RE or when the impedance of the replica circuit 1441 changes continuously to the state of being higher than that of the external resistor RE, the state of being lower than that of the external resistor RE, and the state of being higher than that of the external resistor RE. That is, the impedance control is always completed when the impedance $Z_{1441}$ of the pull-up replica circuit 1441 exceeds the target impedance Ze twice. Due to this, the time required for hit determination is constant whether the impedance of the replica circuit 1441 at start of the impedance control is higher or lower than that of the external resistor RE.

When the impedance of the replica circuit 1441 changes continuously to the state of being lower than that of the external resistor RE, the state of being higher than that of the external resistor RE, and the state of being lower than that of the external resistor RE, the hit signal hit2(a) output from the decision circuit 2472a is selected. Therefore, the impedance control is completed when the impedance of the replica circuit 1443 changes continuously to the state of being higher than that of the replica circuit 1441, the state of being lower than that of the replica circuit 1441, and the state of being higher than that of the replica circuit 1441. Conversely, when the impedance of the replica circuit 1441 changes continuously to the state of being higher than that of the external resistor RE, the state of being lower than that of the external resistor RE, and the state of being higher than that of the external resistor RE, the hit signal hit2(*b*) output from the decision circuit 3472 is selected. Therefore, the impedance control is completed when the impedance of the replica circuit 1443 changes continuously to the state of being lower than that of the replica circuit 1441, the state of being higher than that of the replica circuit 1441, and the state of being lower than that of the replica circuit 1441.

In this way, according to the third embodiment, it is possible to make the time required for hit determination constant irrespectively of the impedance of the replica circuit 1441 at start of impedance control. This can realize faster impedance control.

The fourth embodiment is described below.

In the first embodiment, a change direction of the pull-down comparison signal COMP2 is opposite in phase to that of the impedance of the pull-down replica circuit 1443. Specifically, the pull-down impedance decreases when the comparison signal COMP2 is high level, and increases when the comparison signal COMP2 is low level.

An impedance control circuit 140*a* according to the fourth embodiment is configured so that the change direction of the pull-down comparison signal COMP2 is equal in phase to that of the impedance of the pull-down replica circuit 1443. Specifically, the impedance control circuit 140*a* according to the fourth embodiment is configured so that the pull-down impedance increases when the comparison signal COMP2 is high level, and decreases when the comparison signal COMP2 is low level. Therefore, it is necessary to use a decision circuit different in circuit configuration from the decision circuit 1471, instead of the decision circuit 1472 having the same circuit configuration to that of the decision circuit 1471.

Figure 20:
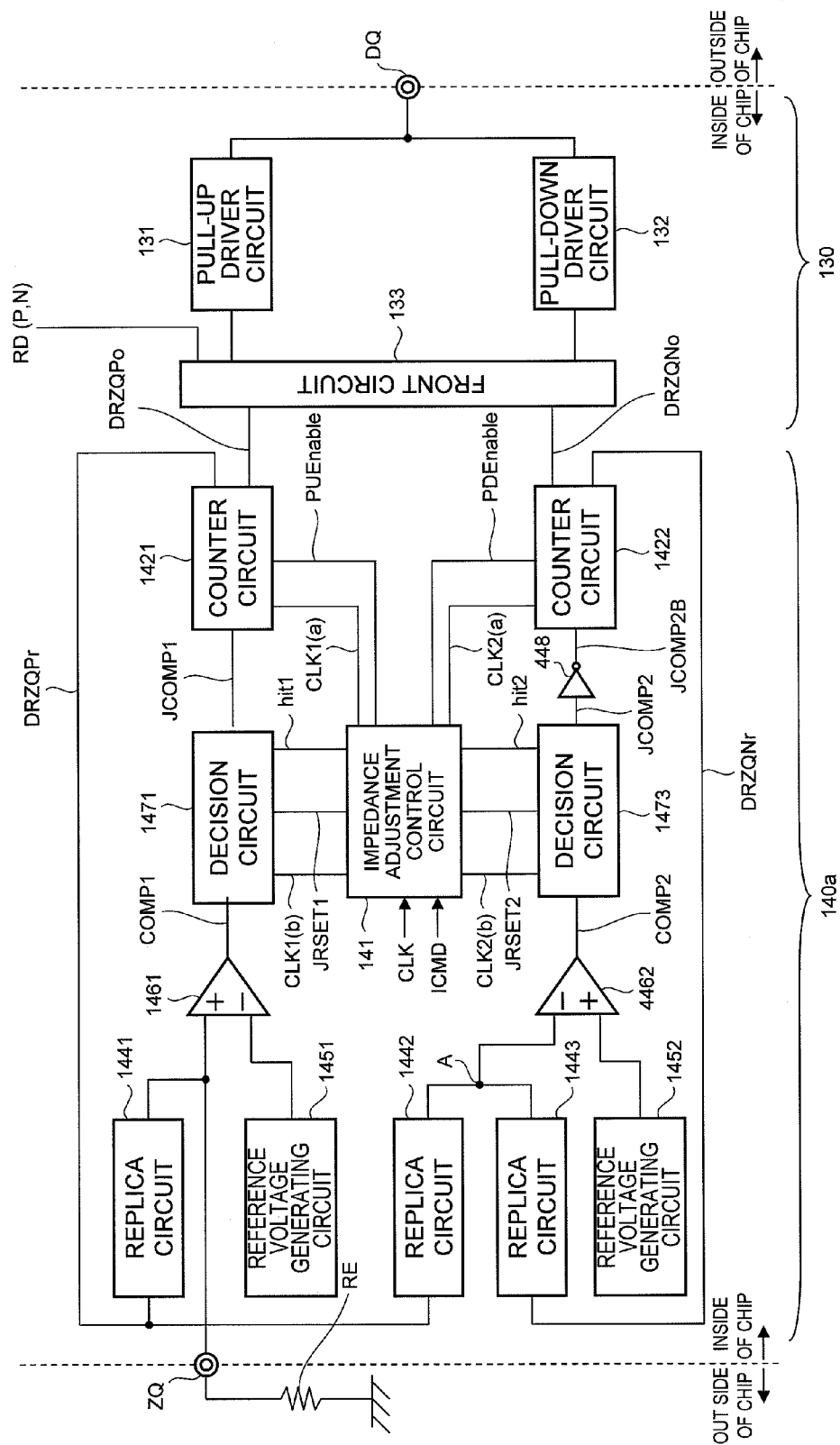
FIG. 20 is a block diagram of the impedance control circuit according to the fourth embodiment.

FIG. 20 is a block diagram of the impedance control circuit 140*a* according to the fourth embodiment.

As shown in FIG. 20, the impedance control circuit 140*a* according to the fourth embodiment is different from the impedance control circuit 140 shown in FIG. 2 in the following respects. A comparison circuit 4462 is used instead of the comparison circuit 1462, the decision circuit 1473 is used instead of the decision circuit 1472, and an inverter circuit 448 is provided between the decision circuit 1473 and the counter circuit 1422. The impedance control circuit 140*a* is identical to the impedance control circuit 140 in other parts of the configuration.

The comparison circuit 4462 compares the potential of the node A that is the contact between the replica circuits 1442 and 1443 with the reference potential VDD/2 supplied from the reference voltage generation circuit 1452, and supplies the comparison result to the decision circuit 1473. A non-inverting input terminal (+) of the comparison circuit 4462 is connected to the output of the reference voltage generation circuit 1452 whereas an inverting input terminal (−) thereof is connected to the contact A. When the potential of the contact A is higher than the reference potential VDD/2, that is, the impedance of the replica circuit 1443 is higher than that of the replica circuit 1442, the comparison circuit 1462 sets the comparison signal COMP2 to low level. When the potential of the contact A is lower than the reference potential, that is, the impedance of the replica circuit 1443 is lower than that of the replica circuit 1442, the comparison circuit 1462 sets the comparison signal COMP2 to high level.

Figure 12:
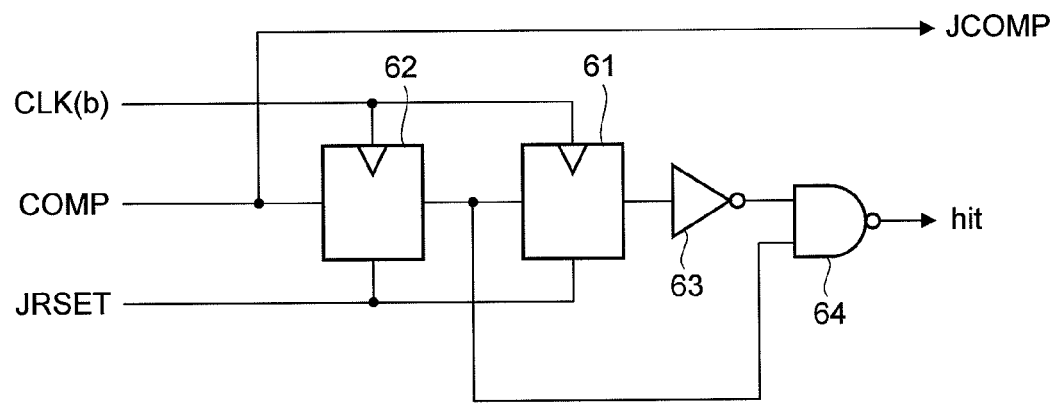
FIG. 12 is a first circuit diagram of the decision circuit according to the second embodiment.

The decision circuit 1473 detects a change of the logic level of the comparison signal COMP2, activates the high signal hit2 when the logic level of the comparison signal COMP2 changes in a predetermined change pattern, and supplies the hit signal hit2 to the impedance adjustment control circuit 141*a*. The circuit configuration of the decision circuit 1473 is shown in FIG. 12. When the hit signal hit2 is activated, the impedance adjustment control circuit 141 stops supplying the impedance control clock signal CLK2(*a*) to the counter circuit 1422. Further, the decision circuit 1473 supplies a comparison signal JCOMP2B that is an inverted signal with respect to the comparison signal COMP1 to the counter circuit 1422 via the inverter circuit 448.

As described above, the decision circuit 1473 changes the hit signal hit2 to low level that is an active state only when the comparison signal COMP2 changes from low level to high level. That is, the decision circuit 1473 activates the hit signal hit2 only when the impedance of the replica circuit 1443 changes from the state of being higher than that of the replica circuit 1442 to the state of being lower than that of the replica circuit 1442. When the impedance adjustment control circuit 141 inputs the reset signal JRSET2 to the decision circuit 1473, the decision circuit 1473 resets data held in the flip-flop circuits 61 and 62 to high level.

Figure 21:
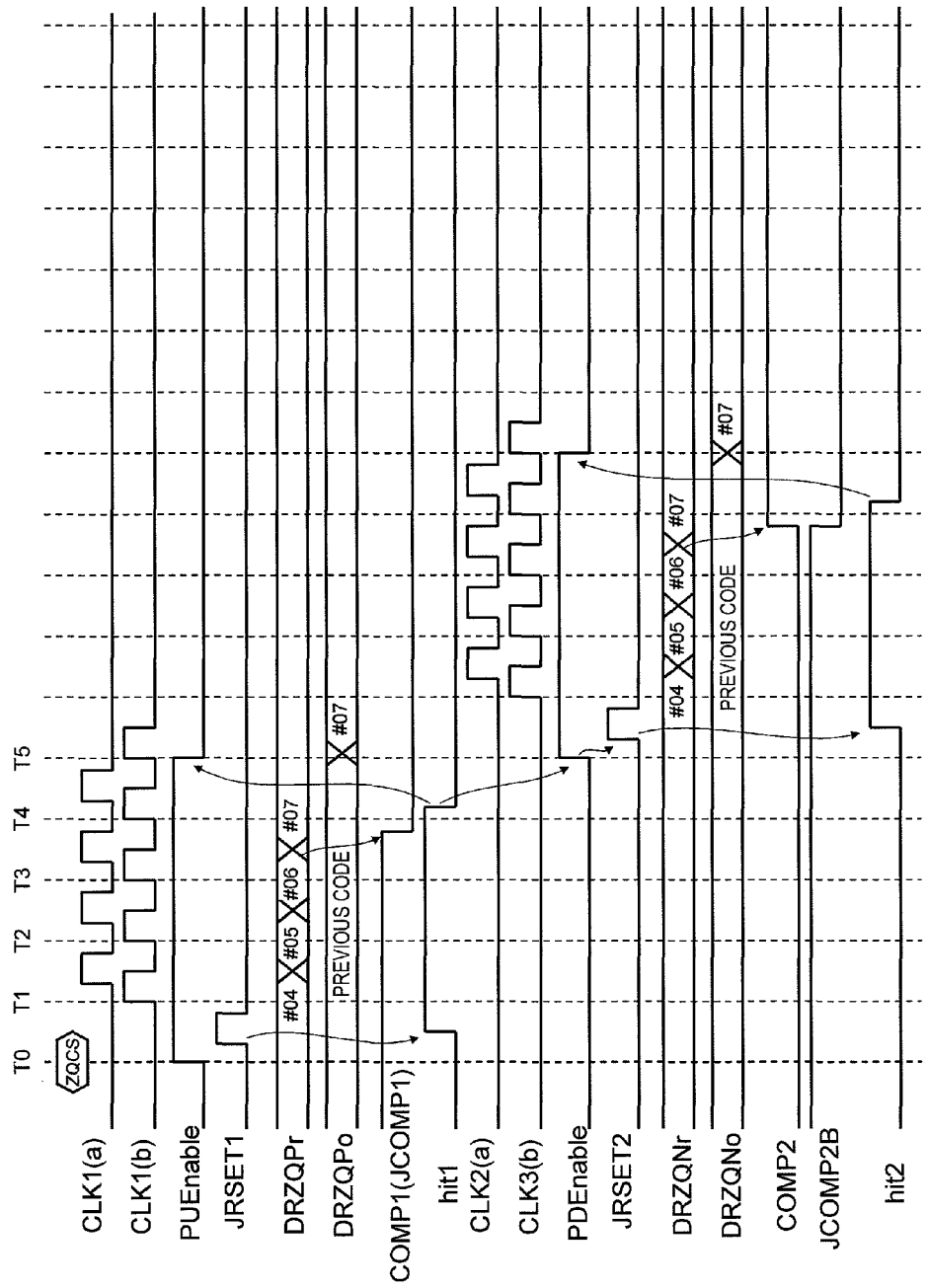
FIG. 21 is a waveform view showing an operation by the impedance control circuit according to the fourth embodiment.

FIG. 21 is a waveform view showing an operation by the impedance control circuit 140 according to the fourth embodiment.

As shown in FIG. 21, the impedance control circuit 140 according to the fourth embodiment operates similarly to the impedance control circuit 140 according to the first embodiment shown in FIG. 8 except that the logic level of the comparison signal COMP2 is inverted. Nevertheless, the inverter circuit 448 inverts the comparison signal JCOMP2 output from the decision circuit 1473 and supplies the inverted comparison signal JCOMP2B to the counter circuit 1422. Due to this, the counter circuit 1422 operates similarly to that included in the impedance control circuit 140 according to the second embodiment.

In this way, even if the impedance control circuit 140 is configured so that the change direction of the comparison signal COMP2 is equal in phase to that of the impedance of the pull-down replica circuit 1443, it is possible to achieve identical effects to those of the second embodiment.

A fifth embodiment of the present invention is described next.

An impedance control circuit according to the fifth embodiment is configured, as compared with the impedance control circuit according to the third embodiment, so that the change direction of the comparison signal COMP2 is equal in phase to that of the impedance of the pull-down replica circuit. The impedance control circuit according to the fifth embodiment is different from that according to the third embodiment in circuit configuration as follows. The comparison circuit 4462 is used instead of the comparison circuit 1462, a decision circuit 5472 (described later) is used instead of the decision circuit 2472, and an inverter circuit is provided between the decision circuit 5472 and the counter circuit 1422. Because the overall configuration of the fifth embodiment is the same as that of the third embodiment, the illustration thereof will be omitted.

Figure 22:
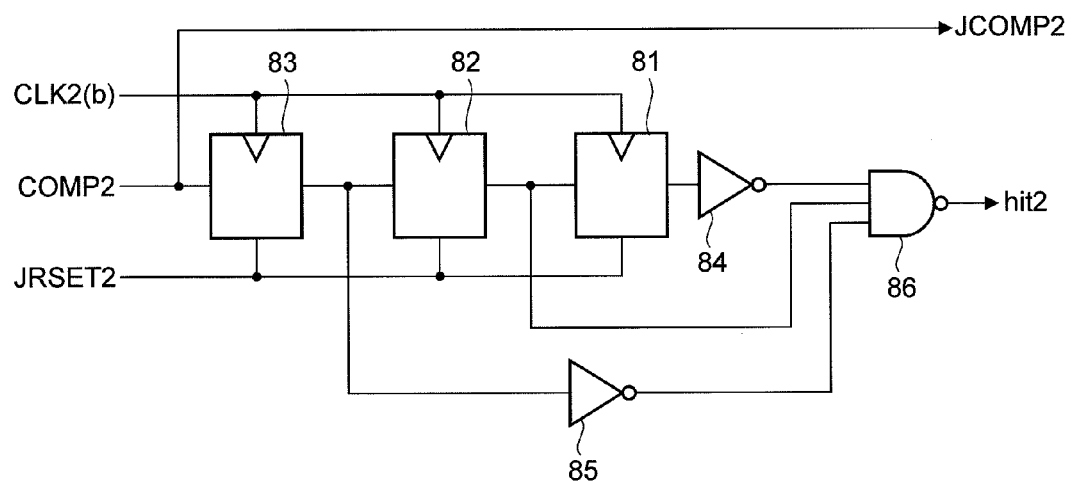
FIG. 22 is a circuit diagram of the decision circuit according to the fifth embodiment.

FIG. 22 is a circuit diagram of the decision circuit 5472.

As shown in FIG. 22, the decision circuit 5472 changes the hit signal hit2 to low level that is an active state only when the comparison signal COMP2 changes continuously to low level, high level, and low level. That is, the decision circuit 5472 activates the hit signal hit2 only when the impedance of the replica circuit 1443 changes from the state of being lower than that of the replica circuit 1442, the state of being higher than that of the replica circuit 1442, and the state of being lower than that of the replica circuit 1442. When an impedance adjustment control circuit 242 (not shown) inputs the reset signal JRSET2 to the decision circuit 5472, the decision circuit 5472 resets data held in the flip-flop circuits 81 and 83 to low level.

Figure 23:
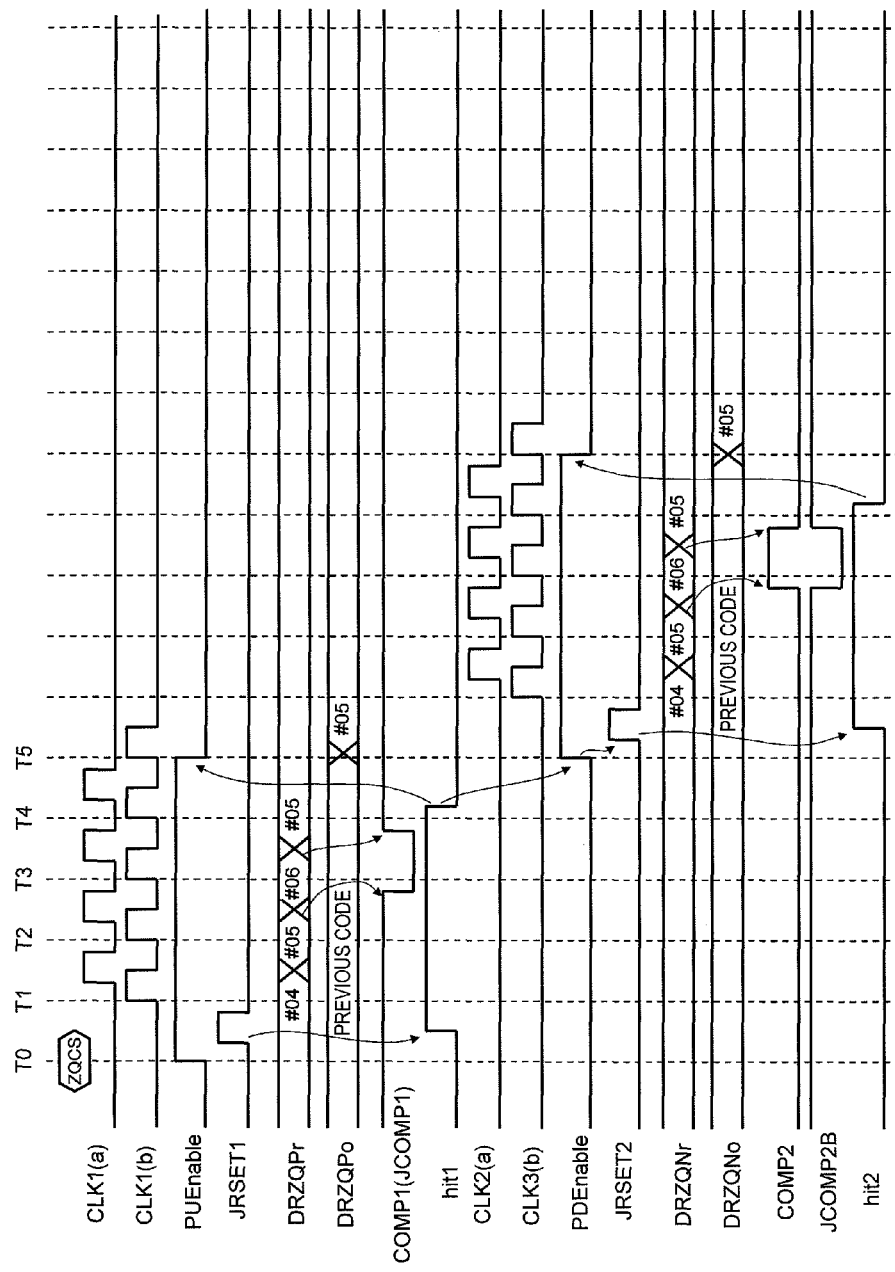
FIG. 23 is a waveform view showing an operation by the impedance control circuit according to the fifth embodiment.
Figure 24:
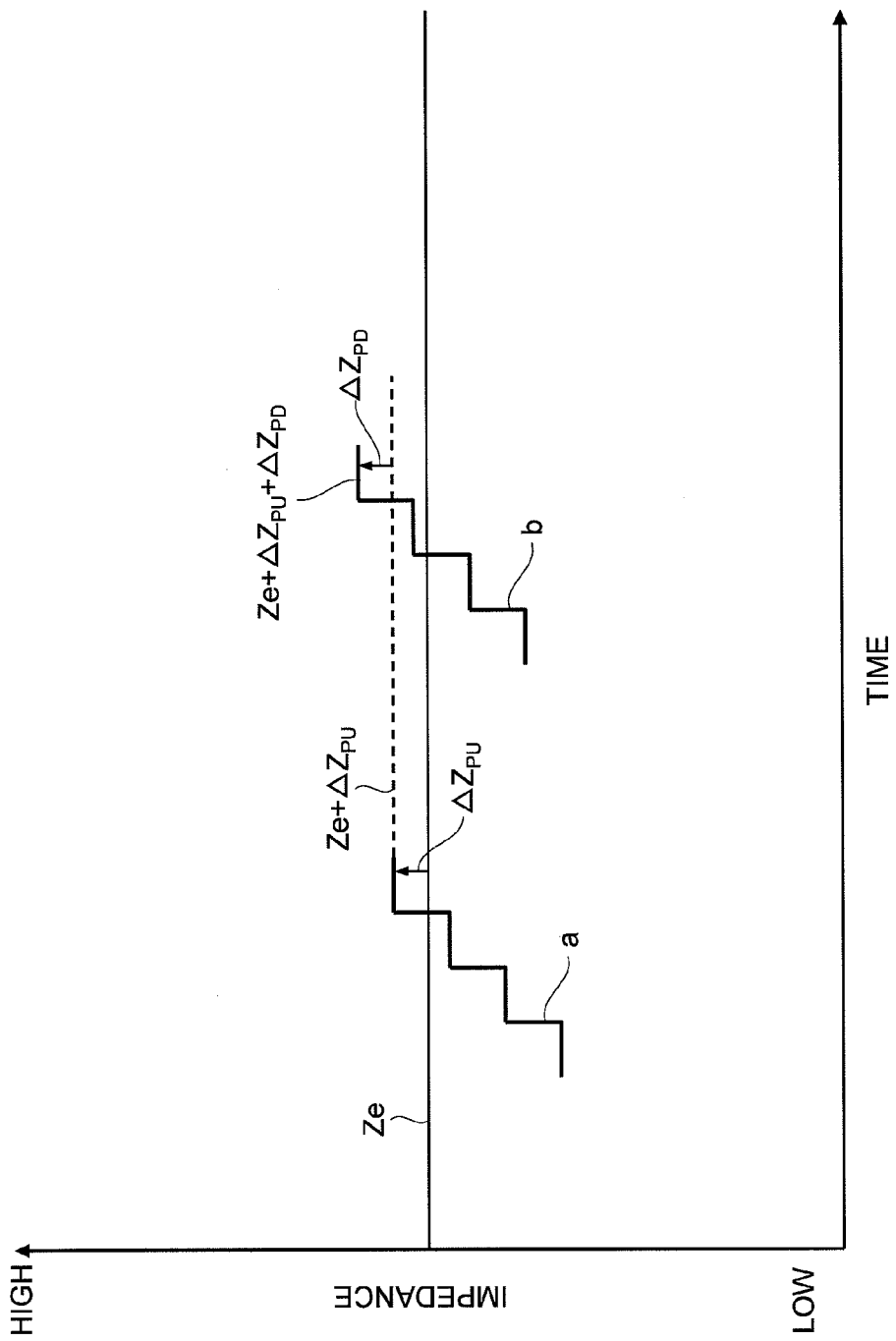
FIG. 24 is a graph for explaining the conventional problems.

FIG. 23 is a waveform view showing an operation by the impedance control circuit according to the fifth embodiment.

As shown in FIG. 23, the impedance control circuit according to the fifth embodiment operates similarly to the impedance control circuit according to the third embodiment shown in FIG. 14 except that the logic level of the comparison signal COMP2 is inverted. Nevertheless, the inverter circuit inverts the comparison signal JCOMP2 output from the decision circuit 5472 and supplies the inverted comparison signal JCOMP2B to the counter circuit 1422. Due to this, the counter circuit 1422 operates similarly to that included in the impedance control circuit according to the third embodiment.

In this way, even if the impedance control circuit is configured so that the change direction of the comparison signal COMP2 is equal in phase to that of the impedance of the pull-down replica circuit, it is possible to achieve identical effects to those of the third embodiment.

It is apparent that the present invention is not limited to the above embodiments, but may be modified and changed without departing from the scope and spirit of the invention.

What is claimed is:

1. A device comprising:
a first terminal;
a first driving circuit coupled to drive the first terminal;
a control circuit coupled to the first driving circuit and including first and second circuit units, the second circuit unit changing a first impedance of the first driving circuit in stepwise manner in either direction of up and down to cause the first impedance of the driving circuit to approach or become substantially equal to a first reference value, and the second circuit unit producing a first detection signal when the first impedance of the first driving circuit has reached or crossed the first predetermined value at least two times, the first circuit unit responding to the first detection signal and terminating changing the first impedance of the first driving circuit, and
a second terminal, and
wherein the second circuit unit comprises:
a second driving circuit coupled to the second terminal and indicative of a second impedance relative to the first impedance,
a first comparator circuit comparing a voltage of the second terminal with a first predetermined voltage and generating a first comparing signal taking one of first and second logic levels based on a comparing result thereby, and
at least three first flip-flop circuits connected such that an output node of a preceding one of the first flip-flop circuits is connected an input node of a succeeding one of the first flip-flop circuits, and leading one of the first flip-flop circuits receiving the first comparing signal at an input node thereof.

2. The device as claimed in claim 1, wherein the device is supplied with an impedance adjusting command from an outside of the device, and the first circuit unit of the control circuit responding to the impedance adjusting command to start changing the first impedance of the first driving circuit.

3. The device as claimed in claim 1, wherein the second impedance of the second driving circuit changes similarly to the first impedance of the first driving circuit.

4. The device as claimed in claim 1, wherein the second circuit unit comprises a first logic circuit coupled in common to output nodes of the first flip-flop circuits and performing a first logic operation on logic levels at the output nodes of the first flip-flop circuits to generate the first detection signal.

5. The device as claimed in claim 4, wherein the second circuit unit comprises at least three second flip-flop circuits connected such that an output node of a preceding one of the second flip-flop circuits is connected an input node of a succeeding one of the second flip-flop circuits, and leading one of the second flip-flop circuits receiving the first comparing signal at an input node thereof, the second circuit unit further comprises a second logic circuit coupled in common to output nodes of the second flip-flop circuits and performing a second logic operation different from the first logic operation on logic levels at the output nodes of the second flip-flop circuits to generate the first detection signal.

6. The device as claimed in claim 1, wherein the first circuit unit comprises an adjustment control circuit generating a first clock signal and a second clock signal delayed the first clock signal, the adjustment control circuit receiving the first detection signal and deactivating the first and second clock signals responding to the first detection signal, the first circuit unit further comprises a counter circuit receiving the second clock signal and the first comparing signal and counting clock pulses of the second clock signal so as to change a counter value thereof in either direction of up and down in response to a logic level of the first comparing signal, the first circuit unit changing a first impedance of the first driving circuit based on the counter value of the counter circuit, and each of the first flip-flop circuits operates in response to the first clock signal.

7. The device as claimed in claim 1, further comprising a third driving circuit coupled to drive the first terminal, and wherein the control circuit coupled to the third driving circuit and including a third circuit unit, the third circuit unit changing a third impedance of the third driving circuit in stepwise manner in either direction of up and down to cause the third impedance of the third driving circuit to approach or become substantially equal to a second reference value, and the third circuit unit producing a second detection signal when the third impedance of the third driving circuit has reached or crossed the second reference value at least two times, the first circuit unit responding to the second detection signal and terminating changing the third impedance of the third driving circuit.

8. The device as claimed in claim 7, wherein the first circuit unit controls the first driving circuit such that the first impedance is a first adjusted impedance value at a first timing when the first circuit unit terminates changing the first impedance of the first driving circuit, the first adjusted impedance value is one of higher and lower in level than the first reference impedance value, the first circuit unit controls the third driving circuit such that the third impedance is a second adjusted impedance value at a second timing when the first circuit unit terminates changing the third impedance of the third driving circuit, the second adjusted impedance value is the other of the higher and the lower in level than the second reference impedance value.

9. The device as claimed in claim 7,
wherein the third circuit unit comprises:
fourth and fifth driving circuits coupled in serial at a node to each other, the fourth driving circuit being indicative of a fourth impedance relative to the first impedance, and the fifth driving circuit being indicative of a fifth impedance relative to the third impedance,
a second comparator circuit comparing a voltage of the node with a second predetermined voltage and generating a second comparing signal taking one of third and fourth logic levels based on a comparing result thereby, and at least three second flip-flop circuits connected such that an output node of a preceding one of the second flip-flop circuits is connected an input node of a succeeding one of the second flip-flop circuits, and leading one of the second flip-flop circuits receiving the second comparing signal at an input node thereof.

10. The device as claimed in claim 9, wherein the second impedance of the second driving circuit and the fourth impedance of the fourth driving circuit change similarly to the first impedance of the first driving circuit and the fifth impedance of the fifth driving circuit changes similarly to the third impedance of the third driving circuit.

11. The device as claimed in claim 7, wherein the first driving circuit drives, when activated, the firs terminal to a fifth logic level and the third driving circuit drives, when activated, the first terminal to a sixth logic level different from the fifth logic level.

12. A device comprising:
a first terminal:
first and second driving circuits each coupled to drive the first terminal;
a first circuit unit coupled to the first driving circuit and configured to change a first impedance of the first driving circuit such that the first impedance of the first driving circuit approaches or becomes substantially equal to a first reference value, the first circuit unit being configured to produce a first detection signal when the first impedance of the first driving circuit has crossed the first reference value from one of higher and lower levels than a level of the first reference value to the other of higher and lower levels than the level of the first reference value;
a second circuit unit coupled to the second driving circuit and configured to change, after the first circuit unit produces the first detection signal, a second impedance of the second driving circuit such that the second impedance of the second driving circuit approaches or becomes substantially equal to a second reference value, the second circuit unit being configured to produce a second detection signal, in a first condition which the first circuit unit has produced the first detection signal when the first impedance of the first driving circuit has crossed the first reference value from the higher level than the level of the first reference value to the lower level than the level of the first reference value, when the second impedance of the second driving circuit has crossed the second reference value from a lower level than a level of the second reference value to a higher level than the level of the second reference value, the second circuit unit being configured not to produce the second detection signal, in the first condition, when the second impedance of the second driving circuit has crossed the second reference value from the higher level than the level of the second reference value to the lower level than the level of the second reference value, the second circuit unit being configured to produce a second detection signal, in a second condition which the first circuit unit has produced the first detection signal when the first impedance of the first driving circuit has crossed the first reference value from the lower level than the level of the first reference value to the higher level than the level of the first reference value, when the second impedance of the second driving circuit has crossed the second reference value from the higher level than the level of the second reference value to the lower level than the level of the second reference value, the second circuit unit being configured not to produce the second detection signal, in the second condition, when the second impedance of the second driving circuit has crossed the second reference value from the lower level than the level of the second reference value to the higher level than the level of the second reference value; and
a third circuit unit configured to terminate changing the first impedance in response to the first detection signal and to terminate changing the second impedance in response to the second detection signal, and
wherein the first circuit unit includes a first decision circuit configured to detect whether the first impedance of the first driving circuit has crossed the first reference value and generating the first detection signal, the first decision circuit includes at least two first flip-flop circuits connected in series to each other, the second circuit unit includes a second decision circuit configured to detect whether the second impedance of the second driving circuit has crossed the second reference value and generating the second detection signal, and the second decision circuit includes at least two second flip-flop circuits connected in series to each other.

13. The device as claimed in claim 12, wherein the first detection circuit of the first circuit unit is equal in circuit structure to the second detection circuit of the second circuit unit.

14. The device as claimed in claim 12, wherein the first decision circuit includes at least three first flip-flop circuits connected in series to each other, and the second decision circuit includes at least three second flip-flop circuits connected in series to each other.

15. The device as claimed in claim 14, wherein the first detection circuit of the first circuit unit is equal in circuit structure to the second detection circuit of the second circuit unit.

16. The device as claimed in claim 12, further comprising a second terminal, and wherein the first circuit unit comprises:
a third, driving circuit coupled to the second terminal and indicative of a third impedance relative to the first impedance, and
a first comparator circuit comparing a voltage of the second terminal with a first voltage and generating a first comparing signal taking one of first and second logic levels based on a comparing result thereby, and
leading one of the first flip-flop circuits receiving the first comparing signal at an input node thereof, and the second circuit unit comprises;
fourth and fifth driving circuits coupled to each other at a first connection node, the fourth driving circuit indicating of a fourth impedance relative to the third impedance, and the fifth driving circuit indicating of a fifth impedance relative to the second impedance, and
a second comparator circuit comparing a voltage of the first connection node with the first voltage and generating a second comparing signal taking one of the first and second logic levels based on a comparing result thereby, and
leading one of the second flip-flop circuits receiving the second comparing signal at an input node thereof.

17. The device as claimed in claim 12, wherein the first driving circuit drives, when activated, the first terminal to one of first and second logic levels and the second driving circuit drives, when activated, the first terminal to the other of the first and second logic levels.

18. A method comprising:

adjusting stepwise an impedance of a first driving circuit coupled to a terminal so as to head toward a first reference impedance;

terminating adjusting the impedance of the first driving circuit when the impedance of the first driving circuit crosses the first reference impedance at least once, the first driving circuit being thereby adjusted to represent a first final impedance that is in a first selected one of a first range greater than the first reference impedance and a second range smaller than the first reference impedance;

adjusting stepwise an impedance of a second driving circuit coupled to the terminal so as to head toward a second reference impedance; and terminating adjusting the impedance of the second driving circuit when the impedance of the second driving circuit crosses the second reference impedance at least once, the second driving circuit being thereby adjusted to a second final impedance that is in a second selected one of a third range greater than the second reference impedance and a fourth range smaller than the second reference impedance, the first range being selected as the first selected one when the fourth range is selected as the second selected one, and the second range being selected as the first selected one when the third range is selected as the second selected one.

* * * * *